(12) United States Patent
Fujiyama et al.

(10) Patent No.: US 9,882,134 B2
(45) Date of Patent: Jan. 30, 2018

(54) POLYMER COMPOUND, MATERIAL FOR ORGANIC ELECTROLUMINESCENCE ELEMENT USING SAME, AND ORGANIC ELECTROLUMINESCENCE ELEMENT

(71) Applicant: IDEMITSU KOSAN CO., LTD., Chiyoda-ku (JP)

(72) Inventors: Takahiro Fujiyama, Kisarazu (JP); Tomoki Kato, Ichihara (JP); Masakazu Funahashi, Chiba (JP)

(73) Assignee: IDEMITSU KOSAN CO., LTD., Chiyoda-ku (JP)

( * ) Notice: Subject to any disclaimer, the term of this patent is extended or adjusted under 35 U.S.C. 154(b) by 93 days.

(21) Appl. No.: 14/891,812

(22) PCT Filed: May 16, 2014

(86) PCT No.: PCT/JP2014/002576
§ 371 (c)(1),
(2) Date: Nov. 17, 2015

(87) PCT Pub. No.: WO2014/185079
PCT Pub. Date: Nov. 20, 2014

(65) Prior Publication Data
US 2016/0133842 A1    May 12, 2016

(30) Foreign Application Priority Data

May 17, 2013  (JP) .................................. 2013-105083

(51) Int. Cl.
*H01L 51/50* (2006.01)
*H01L 51/00* (2006.01)
(Continued)

(52) U.S. Cl.
CPC ........ *H01L 51/0035* (2013.01); *C08G 61/124* (2013.01); *C08G 73/0672* (2013.01);
(Continued)

(58) Field of Classification Search
None
See application file for complete search history.

(56) References Cited

U.S. PATENT DOCUMENTS

2003/0165713 A1   9/2003   Oguma et al.
2007/0079701 A1   4/2007   Sayers et al.
(Continued)

FOREIGN PATENT DOCUMENTS

CN   101371376 A   2/2009
CN   101981086 A   2/2011
(Continued)

OTHER PUBLICATIONS

Chen et al., "High Triplet Energy Polymer as Host for Electrophosphorescence with High Efficiency," Journal of the American Chemical Society, vol. 128, (2006), pp. 8549-8558.
(Continued)

*Primary Examiner* — Gregory D Clark
(74) *Attorney, Agent, or Firm* — Oblon, McClelland, Maier & Neustadt, L.L.P.

(57) ABSTRACT

A polymer compound which includes repeating units represented by formula (1-1) or (1-2) and an organic EL device including the polymer compound as an organic layer are provided:

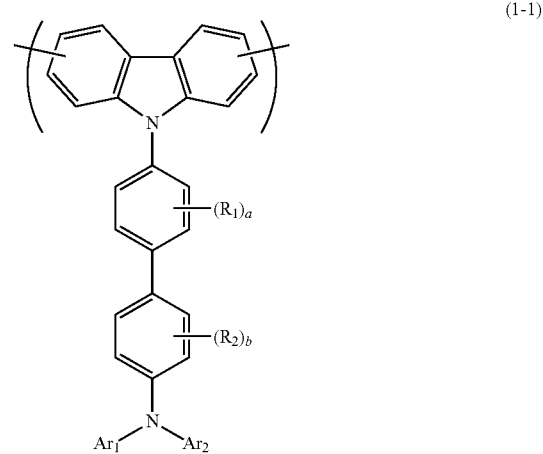

(1-1)

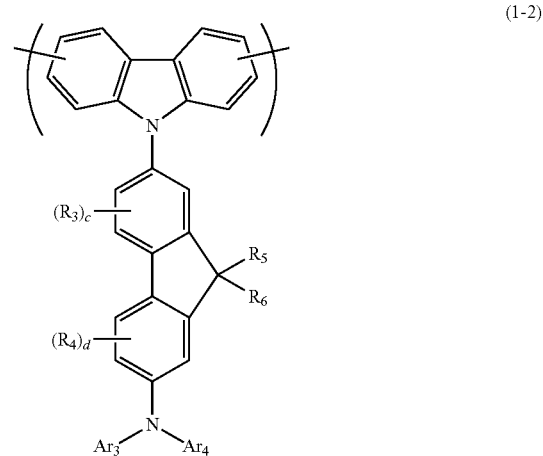

(1-2)

wherein each of $R_1$ to $R_6$ independently represents a linear or branched alkyl group having 1 to 20 carbon atoms, a linear or branched alkoxy group having 1 to 20 carbon atoms, a linear or branched alkylthio group having 1 to 20 carbon atoms, a linear or branched alkenyl group having 2 to 20 carbon atoms, a cycloalkyl group having 3 to 20 carbon atoms, an aryl group having 6 to 30 ring carbon atoms, or a heteroaryl group having 5 to 30 ring atoms; each of a and b independently represents an integer of 0 to 4; each of c and d independently represents an integer of 0 to 3; and each of $Ar_1$, $Ar_2$, $Ar_3$, and $Ar_4$ independently represents a substituted
(Continued)

or unsubstituted aryl group having 6 to 30 ring carbon atoms or a substituted or unsubstituted heteroaryl group having 5 to 30 ring atoms.

13 Claims, No Drawings

(51) Int. Cl.
   *C08G 61/12* (2006.01)
   *C08G 73/06* (2006.01)
   *H05B 33/22* (2006.01)
   *C09K 11/06* (2006.01)

(52) U.S. Cl.
   CPC ........ H01L 51/006 (2013.01); H01L 51/0039 (2013.01); H01L 51/0043 (2013.01); H01L 51/0081 (2013.01); H05B 33/22 (2013.01); *C08G 2261/143* (2013.01); *C08G 2261/148* (2013.01); *C08G 2261/3241* (2013.01); *C09K 11/06* (2013.01); *C09K 2211/1007* (2013.01); *C09K 2211/1011* (2013.01); *C09K 2211/1014* (2013.01); *H01L 51/0052* (2013.01); *H01L 51/0058* (2013.01); *H01L 51/0059* (2013.01); *H01L 51/5012* (2013.01); *H01L 51/5056* (2013.01); *H01L 51/5088* (2013.01)

(56) References Cited

U.S. PATENT DOCUMENTS

2008/0315757 A1* 12/2008 McKiernan ......... H01L 51/0035
                                                    313/504

| 2011/0108814 A1 | 5/2011 | Iida et al. |
| 2012/0074360 A1 | 3/2012 | Funyuu et al. |

FOREIGN PATENT DOCUMENTS

| CN | 102449799 A | 5/2012 |
| JP | 2003 226744 | 8/2003 |
| JP | 2006 316224 | 11/2006 |
| JP | 2008 174661 | 7/2008 |
| JP | 2009 521118 | 5/2009 |
| JP | 2009 283509 | 12/2009 |
| JP | 2010 62442 | 3/2010 |
| JP | 2011 105842 | 6/2011 |
| JP | 2011 174061 | 9/2011 |
| JP | 2012 92181 | 5/2012 |
| JP | 2012 214732 | 11/2012 |
| JP | 2012 236970 | 12/2012 |
| JP | 5549879 B2 | 5/2014 |
| WO | 2009 123269 | 10/2009 |
| WO | 2010 140553 | 12/2010 |

OTHER PUBLICATIONS

International Search Report dated Aug. 19, 2014 in PCT/JP14/002576 Filed May 16, 2014.
Combined Chinese Office Action and Search Report dated Sep. 2, 2016 in Patent Application No. 201480028646.9.

* cited by examiner

POLYMER COMPOUND, MATERIAL FOR ORGANIC ELECTROLUMINESCENCE ELEMENT USING SAME, AND ORGANIC ELECTROLUMINESCENCE ELEMENT

TECHNICAL FIELD

The present invention relates to polymer compounds, materials for organic electroluminescence devices comprising the polymer compounds, and organic electroluminescence devices employing the polymer compounds.

BACKGROUND ART

In recent years, research and development has been actively made on functional materials of organic compound. Recently, the development of an organic electroluminescence device (organic EL device) employing an organic compound as a material for constituting a light emitting device is promoted actively.

An organic electroluminescence device has a structure wherein a thin film comprising a light emitting organic compound is interposed between an anode and a cathode. The electrons and the holes each injected into the thin film recombine to generate excitons. The organic electroluminescence device emits light which is released from the excitons when deactivated. An organic electroluminescence device is capable of emitting light in response to a direct current at a voltage as low as about several volts to tens of volts and emitting light with various colors, for example, red, blue and green, by changing the kind of light emitting organic compound to be used. With these characteristics, an organic electroluminescence device is expected to be applied to various light emitting devices, display devices, etc.

The thin film with a thickness of 1 μm or less which includes a low molecular weight compound as a light emitting organic compound is generally formed by a vacuum vapor deposition method. However, a vacuum vapor deposition method requires an expensive vapor deposition apparatus, in addition, its production efficiency is not high and a large-sized substrate is difficult to use in some cases. An organic electroluminescence device employing only a low molecular weight compound may be poor in the mechanical strength and the heat stability of the thin film. Recently, the development of an organic electroluminescence device employing a light emitting conjugated polymer as the light emitting organic compound (polymer organic electroluminescence device) has been actively promoted, because a polymer enables the patterning by a printing method and is advantageous as a material for producing a large-sized TV panel and a flexible sheet display.

The inventors have developed and proposed a new polymer compound having a thiophene derivative in the polymer backbone (for example, Patent Document 1). Many studies have been made on polymer organic electroluminescence devices because of their advantages of capable of forming films by a coating or printing method (Patent Documents 2 to 4). However, as compared with an organic electroluminescence device employing a low molecular weight compound, the emission efficiency of a polymer organic electroluminescence device is low. In addition, it has been required to further improve the efficiency and lifetime of an organic electroluminescence device employing a polymer.

PRIOR ART

Patent Documents

Patent Document 1: JP 2006-316224A
Patent Document 2: JP 2011-174061A
Patent Document 3: JP 2012-214732A
Patent Document 4: JP 2012-236970A

SUMMARY OF THE INVENTION

Problems to be Solved by the Invention

An object of the invention is to provide a new polymer compound suitable for an organic electroluminescence device and an organic electroluminescence device employing such a polymer compound. As a result of extensive research, the inventors have found a polymer compound which has a high charge transporting ability and is capable of forming a uniform thin film. It has been further found that a high efficiency and a long lifetime can be obtained by using such a polymer compound in an organic electroluminescence device. The present invention is based on these findings.

Means for Solving the Problem

As a result of extensive research, the inventors have found that a polymer compound comprising repeating units represented by formula (1-1) or (1-2) is useful as a hole transporting material, etc. The present invention is based on this finding. Namely, the present invention provides the following items (1) to (10).

(1) A polymer compound comprising repeating units represented by formula (1-1) or (1-2);

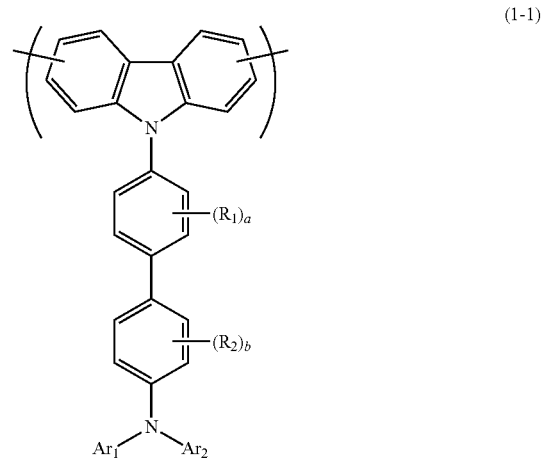

(1-1)

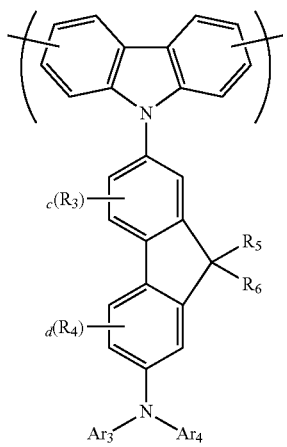

(7) The polymer compound of any one of items (1) to (6), wherein the polymer compound further comprises repeating units represented by formula (3):

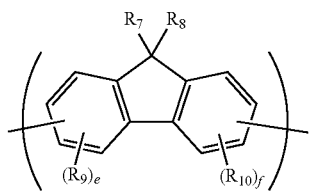

wherein each of $R_1$ to $R_6$ independently represents a linear or branched alkyl group having 1 to 20 carbon atoms, a linear or branched alkoxy group having 1 to 20 carbon atoms, a linear or branched alkylthio group having 1 to 20 carbon atoms, a linear or branched alkenyl group having 2 to 20 carbon atoms, a cycloalkyl group having 3 to 20 carbon atoms, an aryl group having 6 to 30 ring carbon atoms, or a heteroaryl group having 5 to 30 ring atoms; each of a and b represents an integer of 0 to 4; each of c and d represents an integer of 0 to 3; and each of $Ar_1$ to $Ar_4$ independently represents a substituted or unsubstituted aryl group having 6 to 30 ring carbon atoms or a substituted or unsubstituted heteroaryl group having 5 to 30 ring atoms.

(2) The polymer compound of item (1), wherein each of $R_1$ to $R_3$ represents a linear or branched alkyl group having 1 to 20 carbon atoms, a linear or branched alkenyl group having 2 to 20 carbon atoms, a cycloalkyl group having 3 to 20 carbon atoms, an aryl group having 6 to 30 ring carbon atoms, or a heteroaryl group having 5 to 30 ring atoms.

(3) The polymer compound of item (1), wherein each of $R_1$ to $R_6$ represents a linear or branched alkyl group having 1 to 20 carbon atoms, a linear or branched alkoxy group having 1 to 20 carbon atoms, a linear or branched alkylthio group having 1 to 20 carbon atoms, a linear or branched alkenyl group having 2 to 20 carbon atoms, a cycloalkyl group having 3 to 20 carbon atoms, an aryl group having 6 to 24 ring carbon atoms, or a heteroaryl group having 5 to 24 ring atoms.

(4) The polymer compound of item (1), wherein each of $R_1$ to $R_6$ represents a linear or branched alkyl group having 1 to 20 carbon atoms, a linear or branched alkenyl group having 2 to 20 carbon atoms, a cycloalkyl group having 3 to 20 carbon atoms, an aryl group having 6 to 24 ring carbon atoms, or a heteroaryl group having 5 to 24 ring atoms.

(5) The polymer compound of any one of items (2) to (4), wherein each of $Ar_1$, $Ar_2$, $Ar_3$, and $Ar_4$ independently represents a substituted or unsubstituted aryl group having 6 to 24 ring carbon atoms or a substituted or unsubstituted heteroaryl group having 5 to 24 ring atoms.

(6) The polymer compound of any one of items (1) to (5), wherein the polymer compound further comprises repeating units represented by formula (2):

$$-(Ar_5)- \qquad (2)$$

wherein $Ar_5$ represents an arylene group having 6 to 24 ring carbon atoms or a heteroarylene group having 5 to 24 ring atoms.

wherein each of $R_7$, $R_8$, $R_9$, and $R_{10}$ independently represents a linear or branched alkyl group having 1 to 20 carbon atoms, a linear or branched alkenyl group having 2 to 20 carbon atoms, a cycloalkyl group having 3 to 20 carbon atoms, an aryl group having 6 to 30 ring carbon atoms, or a heteroaryl group having 5 to 30 ring atoms; $R_9$ and $R_{10}$ may be bonded to each other to form a hydrocarbon ring; each of e and f represents an integer of 0 to 3; when e or f is 2, adjacent groups $R_9$ or adjacent groups $R_{10}$ may be bonded to each other to form a hydrocarbon ring; and at least one selected from the group consisting of $R_7$, $R_8$, $R_9$, and $R_{10}$ has a substituent comprising a polymerizable functional group.

(8) The polymer compound of item (7), wherein the group comprising a polymerizable functional group is selected from the group consisting of;

a group represented by formula (i):

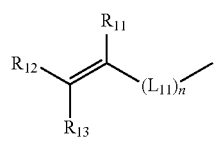

wherein each of $R_{11}$, $R_{12}$ and $R_{13}$ independently represents a hydrogen atom, a fluorine atom, a linear or branched alkyl group having 1 to 20 carbon atoms, or a substituted or unsubstituted aryl group having 6 to 30 ring carbon atoms; $L_{11}$ represents a divalent linking group; and n represents 0 or 1, provided that when n is 0, $L_{11}$ is a single bond;

a group represented by formula (ii):

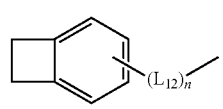

wherein $L_{12}$ represents a divalent linking group and n represents 0 or 1, provided that when n is 0, $L_{12}$ is a single bond;

a group represented by formula (iii):

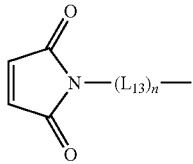

wherein $L_{13}$ represents a divalent linking group and n represents 0 or 1, provided that when n is 0, $L_{13}$ is a single bond;

a group represented by formula (iv):

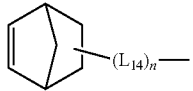

wherein $L_{14}$ represents a divalent linking group and n represents 0 or 1, provided that when n is 0, $L_{14}$ is a single bond;

a group represented by formula (V):

wherein $R_{14}$ represents a hydrogen atom, a substituted or unsubstituted linear or branched alkyl group having 1 to 20 carbon atoms, or a substituted or unsubstituted aryl group having 6 to 24 ring carbon atoms; $L_{15}$ represents a divalent linking group, and n represents 0 or 1, provided that when n is 0, $L_{15}$ is a single bond; and a group other than the group represented by any of formulae (i) to (v), which comprises a ring-forming or ring-opening polymerizable functional group selected from the group consisting of a group comprising a substituted or unsubstituted norbornene skeleton, a group comprising a substituted or unsubstituted epoxy group or oxetane group, a group comprising a lactone structure or a lactam structure, a cyclooctatetraene group, a 1,5-cyclooctadiene group, a 1,ω-diene group, an o-divinylbenzene group, and a 1,ω-diyne group.

(9) A material for organic electroluminescence devices comprising the polymer compound of any one of items (1) to (8).

(10) An organic electroluminescence device which comprises at least one layer between a pair of electrodes and the at least one layer comprises at least one polymer compound according to any one of items (1) to (8).

(11) The organic electroluminescence device of item (10), wherein the layer comprising the polymer compound is a charge injection transport layer.

(12) The organic electroluminescence device of item (11), wherein the charge injection transport layer is a hole injection transport layer.

(13) The organic electroluminescence device of any one of items (10) to (12), wherein the organic electroluminescence device comprises a light emitting layer between the pair of electrodes, and the light emitting layer comprises a light emitting compound other than the polymer compound.

(14) The organic electroluminescence device of any one of items (10) to (13), wherein the organic electroluminescence device comprises an electron injection transport layer between the pair of electrodes, and the electron injection transport layer comprises an electron injecting compound other than the polymer compound.

Effects of the Invention

An organic electroluminescence device which comprises the material for organic electroluminescence devices comprising the polymer compound of the invention exhibits a high emission efficiency and a long lifetime.

MODE FOR CARRYING OUT THE INVENTION

The present invention will described below.
Polymer Compound

The polymer compound of the invention comprises repeating units represented by formula (1-1) or (1-2). The polymer compound may comprise a single kind or two or more kinds of the repeating units represented by formula (1-1) or (1-2). When the polymer compound comprises two or more kinds of the repeating units represented by formula (1-1) or (1-2), different repeating units may be bonded to each other alternately or randomly, or the same units are bonded sequentially and then different units are bonded sequentially.

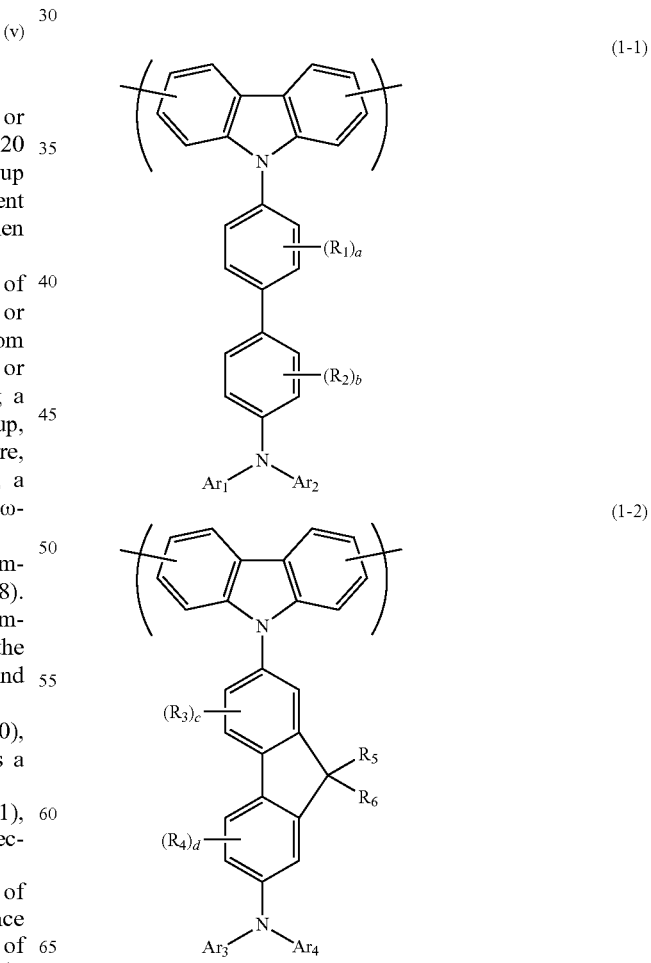

In formula (1-1) or (1-2), each of $R_1$ to $R_6$ independently represents a linear or branched alkyl group having 1 to 20 carbon atoms, a linear or branched alkoxy group having 1 to 20 carbon atoms, a linear or branched alkylthio group having 1 to 20 carbon atoms, a linear or branched alkenyl group having 2 to 20 carbon atoms, a cycloalkyl group having 3 to 20 carbon atoms, an aryl group having 6 to 30 ring carbon atoms, or a heteroaryl group having 5 to 30 ring atoms.

Preferably, each of $R_1$ to $R_6$ in formula (1-1) or (1-2) independently represents a linear or branched alkyl group having 1 to 20 carbon atoms, a linear or branched alkenyl group having 2 to 20 carbon atoms, a cycloalkyl group having 3 to 20 carbon atoms, an aryl group having 6 to 30 ring carbon atoms, or a heteroaryl group having 5 to 30 ring atoms.

Preferably, each of $R_1$ to $R_3$ in formula (1-1) or (1-2) independently represents a linear or branched alkyl group having 1 to 20 carbon atoms, a linear or branched alkoxy group having 1 to 20 carbon atoms, a linear or branched alkylthio group having 1 to 20 carbon atoms, a linear or branched alkenyl group having 2 to 20 carbon atoms, a cycloalkyl group having 3 to 20 carbon atoms, an aryl group having 6 to 24 ring carbon atoms, or a heteroaryl group having 5 to 24 ring atoms Preferably, each of $R_1$ to $R_3$ in formula (1-1) or (1-2) independently represents a linear or branched alkyl group having 1 to 20 carbon atoms, a linear or branched alkenyl group having 2 to 20 carbon atoms, a cycloalkyl group having 3 to 20 carbon atoms, an aryl group having 6 to 24 ring carbon atoms, or a heteroaryl group having 5 to 24 ring atoms.

Each of a and b represents an integer of 0 to 4, and each of c and d represents an integer of 0 to 3.

Each of $Ar_1$ to $Ar_4$ independently represents a substituted or unsubstituted aryl group having 6 to 30 ring carbon atoms or a substituted or unsubstituted heteroaryl group having 5 to 30 ring atoms, with a substituted or unsubstituted aryl group having 6 to 24 ring carbon atoms or a substituted or unsubstituted heteroaryl group having 5 to 24 ring atoms being preferred.

Examples of the linear or branched alkyl group having 1 to 20 carbon atoms include a methyl group, an ethyl group, a propyl group, an isopropyl group, a butyl group, an isobutyl group, a t-butyl group, a pentyl group, a hexyl group, a heptyl group, an octyl group, a 2-ethylhexyl group, a nonyl group, a decyl group, a 3,7-dimethyloctyl group, and a lauryl group. In view of the solubility of the polymer compound to an organic solvent, the device properties, and the production thereof, preferred are a pentyl group, a hexyl group, an octyl group, a 2-ethylhexyl group, a decyl group, and a 3,7-dimethyloctyl group.

Examples of the linear or branched alkoxy group having 1 to 20 carbon atoms include a methoxy group, an ethoxy group, a propyloxy group, an isopropyloxy group, a butoxy group, an isobutoxy group, a t-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, and a lauryloxy group. In view of the solubility of the polymer compound to an organic solvent, the device properties, and the production thereof, preferred are a pentyloxy group, a hexyloxy group, an octyloxy group, a 2-ethylhexyloxy group, a decyloxy group, and a 3,7-dimethyloctyloxy group.

Examples of the linear or branched alkylthio group having 1 to 20 carbon atoms include a methylthio group, an ethylthio group, a propylthio group, an isopropylthio group, a butylthio group, an isobutylthio group, a t-butylthio group, a pentylthio group, a hexylthio group, a heptylthio group, an octylthio group, a 2-ethylhexylthio group, a nonylthio group, a decylthio group, a 3,7-dimethyloctylthio group, and a laurylthio group. In view of the solubility of the polymer compound to an organic solvent, the device properties, and the production thereof, preferred are a pentylthio group, a hexylthio group, an octylthio group, a 2-ethylhexylthio group, a decylthio group, and a 3,7-dimethyloctylthio group.

Examples of the linear or branched alkenyl group having 2 to 20 carbon atoms include a vinyl group, allyl group, a 1-butenyl group, a 2-butenyl group, a 3-butenyl group, a 1,3-butanedienyl group, a 1-methylvinyl group, a styryl group, a 2,2-diphenylvinyl group, a 1,2-diphenylvinyl group, a 1-methylaryl group, a 1,1-dimethylallyl group, a 2-methylallyl group, a 1-phenylallyl group, a 2-phenylallyl group, a 3-phenylallyl group, a 3,3-diphenylallyl group, a 1,2-dimethylallyl group, a 1-phenyl-1-butenyl group, and a 3-phenyl-1-butenyl group. In view of the solubility of the polymer compound to an organic solvent, the device properties, and the production thereof, preferred are a styryl group, a 2,2-diphenylvinyl group, and a 1,2-diphenylvinyl group.

Examples of the cycloalkyl group having 3 to 20 carbon atoms include a cyclopropyl group, a cyclobutyl group, a cyclopentyl group, and a cyclohexyl group, with a cyclopentyl group and a cyclohexyl group being preferred.

The aryl group is a group of atoms which is derived from an aromatic hydrocarbon by removing one hydrogen atom and may include an aryl group comprising a fused ring and an aryl group comprising a structure in which two or more benzene rings or fused rings are bonded to each other directly or via a group, such as a vinylene linker. Examples of the aryl group having 6 to 30 ring carbon atoms include a phenyl group, a 1-naphthyl group, a 2-naphthyl group, a 1-anthracenyl group, a 2-anthracenyl group, a 9-anthracenyl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a fluorenyl group, a 2-biphenylyl group, a 3-biphenylyl group, a 4-biphenylyl group, a p-terphenyl-4-yl group, a p-terphenyl-3-yl group, a p-terphenyl-2-yl group, a m-terphenyl-4-yl group, a m-terphenyl-3-yl group, and a m-terphenyl-2-yl group. Preferred are a phenyl group, a 1-naphthyl group, a 2-naphthyl group, a 4-biphenylyl group, a p-terphenyl-4-yl group, and a fluorenyl group.

The heteroaryl group is a group of atoms which is derived from a heterocyclic compound by removing one hydrogen atom. Examples of the heteroaryl group having 5 to 30 ring atoms include a 1-pyrrolyl group, a 2-pyrrolyl group, a 3-pyrrolyl group, a 2-furyl group, a 3-furyl group, a 2-thienyl group, a 3-thienyl group, a 3-pyridinyl group, a 3-pyridinyl group, a 4-pyridinyl group, a pyridazinyl group, a pyrimidinyl group, a pyrazinyl group, a triazinyl group, an imidazolyl group, a thiazolyl group, a pyrazolyl group, an isoxazolyl group, an isothiazolyl group, an oxadiazolyl group, a thiadiazolyl group, a triazolyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a benzothiophenyl group, an indolizinyl group, a quinolizinyl group, a 2-quinolyl group, a 3-quinolyl group, a 4-quinolyl group, a 5-quinolyl group, a 6-quinolyl group, a 7-quinolyl group, a 8-quinolyl group, a 1-isoquinolyl group, a 3-isoquinolyl group, a 4-isoquinolyl group, a 5-isoquinolyl group, a 6-isoquinolyl group, a 7-isoquinolyl group, a 8-isoquinolyl group, a cinnolyl group, a phthalazinyl group, a quinazolinyl group, a 2-quinoxalinyl group, a 5-quinoxalinyl group, a 6-quinoxalinyl group, a benzimidazolyl group, a benzoxazolyl group, a benzothiazolyl group, an indazolyl group, a benzisoxazolyl group, a benzisothiazolyl group, a 1-carbazolyl group, a 2-carbazolyl group, a 3-carbazolyl group, a 4-carbazolyl group, a 9-carbazolyl group, a dibenzofuranyl group, a dibenzothiophenyl group, a 1-phenanthridinyl group, a 2-phenanthridinyl group, a 3-phenanthridinyl group, a 4-phenanthridinyl group, a 6-phenanthridinyl group, a 7-phenanthridinyl group, a 8-phenanthridinyl group, a 9-phenanthridinyl group, a 10-phenanthridinyl group, a 1-acridinyl group, a 2-acridinyl group, a 3-acridinyl group, a 4-acridinyl group, a 9-acridinyl group, a 1,7-phenanthroline-2-yl group, a 1,7-phenanthroline-3-yl group, a 1,7-phenanthroline-4-yl group, a 1,7-phenanthroline-5-yl group, a 1,7-phenanthroline-6-yl group, a 1,7-phenanthroline-8-yl group, a 1,7-phenanthroline-9-yl group, a 1,7-phenanthroline-10-yl group, a 1,8-phenanthroline-2-yl group, a 1,8-phenanthroline-3-yl group, a 1,8-phenanthroline-4-yl group, a 1,8-phenanthroline-5-yl group, a 1,8-phenanthroline-6-yl group, a 1,8-phenanthroline-7-yl group, a 1,8-phenanthroline-9-yl group, a 1,8-phenanthroline-10-yl group, a 1,9-phenanthroline-2-yl group, a 1,9-phenanthroline-3-yl group, a 1,9-phenanthroline-4-yl group, a 1,9-phenanthroline-5-yl group, a 1,9-phenanthroline-6-yl group, a 1,9-phenanthroline-7-yl group, a 1,9-phenanthroline-8-yl group, a 1,9-phenanthroline-10-yl group, a 1,10-phenanthroline-2-yl group, a 1,10-phenanthroline-3-yl group, a 1,10-phenanthroline-4-yl group, a 1,10-phenanthroline-5-yl group, a 2,9-phenanthroline-1-yl group, a 2,9-phenanthroline-3-yl group, a 2,9-phenanthroline-4-yl group, a 2,9-phenanthroline-5-yl group, a 2,9-phenanthroline-6-yl group, a 2,9-phenanthroline-7-yl group, a 2,9-phenanthroline-8-yl group, a 2,9-phenanthroline-10-yl group, a 2,8-phenanthroline-1-yl group, a 2,8-phenanthroline-3-yl group, a 2,8-phenanthroline-4-yl group, a 2,8-phenanthroline-5-yl group, a 2,8-phenanthroline-6-yl group, a 2,8-phenanthroline-7-yl group, a 2,8-phenanthroline-9-yl group, a 2,8-phenanthroline-10-yl group, a 2,7-phenanthroline-1-yl group, a 2,7-phenanthroline-3-yl group, a 2,7-phenanthroline-4-yl group, a 2,7-phenanthroline-5-yl group, a 2,7-phenanthroline-6-yl group, a 2,7-phenanthroline-8-yl group, a 2,7-phenanthroline-9-yl group, a 2,7-phenanthroline-10-yl group, a 1-phenazinyl group, a 2-phenazinyl group, a 1-phenothiazinyl group, a 2-phenothiazinyl group, a 3-phenothiazinyl group, a 4-phenothiazinyl group, a 10-phenothiazinyl group, a 1-phenoxazinyl group, a 2-phenoxazinyl group, a 3-phenoxazinyl group, a 4-phenoxazinyl group, a 10-phenoxazinyl group, a 2-oxazolyl group, a 4-oxazolyl group, a 5-oxazolyl group, a 2-oxadiazolyl group, a 5-oxadiazolyl group, a 3-furazanyl group, and a xanthenyl group. Preferred are a furyl group, a thienyl group, a benzofuranyl group, a benzothiophenyl group, a dibenzofuranyl group, and a dibenzothiophenyl group.

The polymer compound of the invention may further comprise the repeating units represented by formula (2):

  (2)

wherein $Ar_5$ represents an arylene group having 6 to 24 ring carbon atoms or a heteroarylene group having 5 to 24 ring atoms.

The arylene group is selected from the divalent groups which are derived from the aryl groups mentioned above by removing one hydrogen atom. Examples of the arylene group include a phenylene group, a biphenylene group, a terphenylene group, a quarterphenylene group, a naphthylene group, an anthracenylene group, a phenanthrylene group, a chrysenylene group, a pyrenylene group, a perylenylene group, and a fluorenylene group, with a phenylene group, a biphenylene group, a terphenylene group, a fluorenylene group, a naphthylene group, and a phenanthrylene group being preferred, and a phenylene group, a biphenylene group, a terphenylene group, a naphthylene group, a phenanthrylene group, and a fluorenylene group being more preferred.

The heteroarylene group is selected from the divalent groups which are derived from the heteroaryl groups mentioned above by removing one hydrogen atom. Examples of the heteroarylene group include a pyridine-diyl, a pyrazine-diyl, a quinoline-diyl, an isoquinoline-diyl, an acridine-diyl, a phenanthroline-diyl, a furan-diyl, a pyrrole-diyl, a thiophene-diyl, an oxazole-diyl, an oxadiazole-diyl, a thiadiazole-diyl, a triazole-diyl, a benzoxazole-diyl, a benzoxadiazole-diyl, a benzothiadiazole-diyl, a benzotriazole-diyl, a benzothiophene-diyl, a benzofuran-diyl, a dibenzothiophene-diyl, and a dibenzofuran-diyl.

The polymer compound of the invention may further comprise the repeating units represented by formula (3):

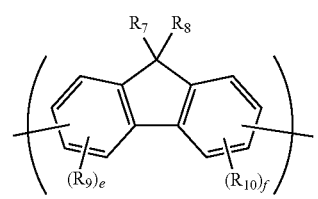  (3)

wherein each of $R_7$, $R_8$, $R_9$, and $R_{10}$ independently represents a linear or branched alkyl group having 1 to 20 carbon atoms, a linear or branched alkenyl group having 2 to 20 carbon atoms, a cycloalkyl group having 3 to 20 carbon atoms, an aryl group having 6 to 30 ring carbon atoms, or a heteroaryl group having 5 to 30 ring atoms.

Preferably, each of $R_7$, $R_8$, $R_9$, and $R_{10}$ independently represents a linear or branched alkyl group having 1 to 20 carbon atoms, a linear or branched alkenyl group having 2 to 20 carbon atoms, a cycloalkyl group having 3 to 20 carbon atoms, an aryl group having 6 to 24 ring carbon atoms, or a heteroaryl group having 5 to 24 ring atoms.

Examples of the alkyl group, the alkenyl group, the cycloalkyl group, the aryl group, and the heteroaryl group for each of $R_7$, $R_8$, $R_9$, and $R_{10}$ are the same as those of the alkyl group, the alkenyl group, the cycloalkyl group, the aryl group, and the heteroaryl group for each of $R_1$ to $R_6$ of formula (1-1) or (1-2).

$R_9$ and $R_{10}$ may be bonded to each other to form a hydrocarbon ring. Examples of such a ring to be formed by $R_9$ and $R_{10}$ bonded to each other are shown below.

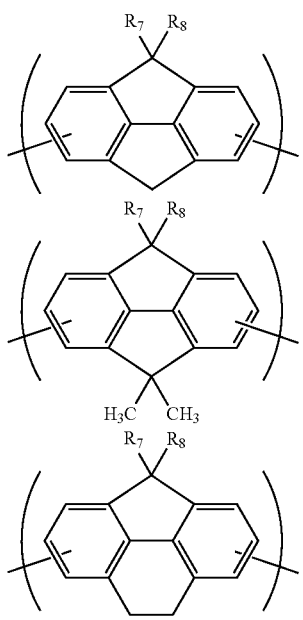

Each of e and f independently represents an integer of 0 to 3. When e or f is 2, adjacent groups $R_9$ or adjacent groups $R_{10}$ may be bonded to each other to form a hydrocarbon ring. Examples of the hydrocarbon ring to be formed by the adjacent groups $R_9$ or the adjacent groups $R_{10}$ are shown below.

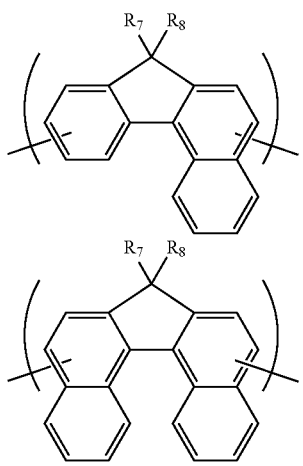

At least one selected from the group consisting of $R_7$, $R_8$, $R_9$ and $R_{10}$ has a substituent comprising a polymerizable functional group.

The polymerizable functional group is a group which forms a new chemical bond together with a neighboring molecule by a reaction when irradiated with heat and/or active energy ray or when receiving energy from another molecule, such as a sensitizer.

The polymerizable functional group is preferably a group comprising an unsaturated double bond, a cyclic ether, a benzocyclobutane ring, etc., although not particularly limited thereto.

In view of easily insolubilizing the polymer compound, the polymerizable functional group is preferably a group represented by formula (i):

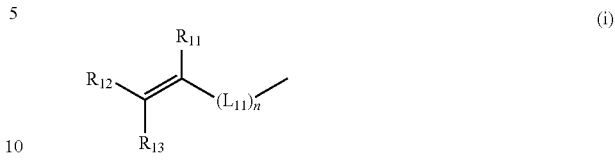

wherein each of $R_{11}$, $R_{12}$ and $R_{13}$ independently represents a hydrogen atom, a fluorine atom, a linear or branched alkyl group having 1 to 20 carbon atoms, or a substituted or unsubstituted aryl group having 6 to 30 ring carbon atoms; $L_{11}$ represents a divalent linking group; and n represents 0 or 1, provided that when n is 0, $L_{11}$ is a single bond;

a group represented by formula (ii):

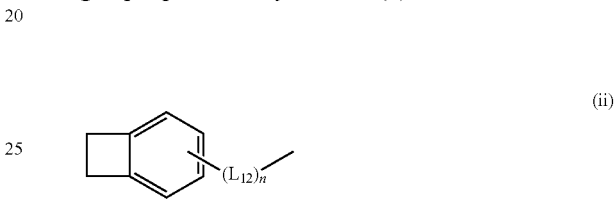

wherein $L_{12}$ represents a divalent linking group and n represents 0 or 1, provided that when n is 0, $L_{12}$ is a single bond;

a group represented by formula (iii):

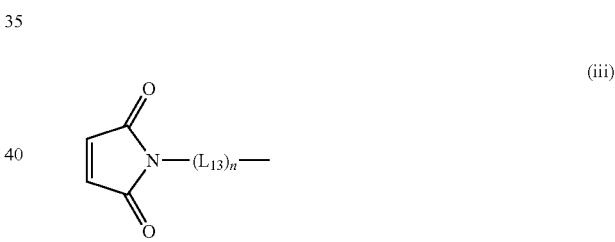

wherein $L_{13}$ represents a divalent linking group and n represents 0 or 1, provided that when n is 0, $L_{13}$ is a single bond;

a group represented by formula (iv):

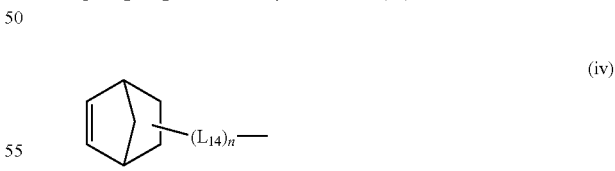

wherein $L_{14}$ represents a divalent linking group and n represents 0 or 1, provided that when n is 0, $L_{14}$ is a single bond;

a group represented by formula (v):

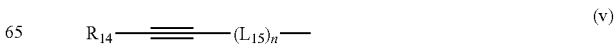

wherein R$_{14}$ represents a hydrogen atom, a substituted or unsubstituted linear or branched alkyl group having 1 to 20 carbon atoms, or a substituted or unsubstituted aryl group having 6 to 30 ring carbon atoms; L$_{15}$ represents a divalent linking group, and n represents 0 or 1, provided that when n is 0, L$_{15}$ is a single bond; or a group other than the group represented by any of formulae (i) to (v), which comprises a ring-forming or ring-opening polymerizable functional group selected from the group consisting of a group comprising a substituted or unsubstituted norbornene skeleton, a group comprising a substituted or unsubstituted epoxy group or oxetane group, a group comprising a lactone structure or a lactam structure, a cyclooctatetraene group, a 1,5-cyclooctadiene group, a 1,ω-diene group, an o-divinylbenzene group, and a 1,ω-diyne group.

Examples of the alkyl group and the aryl group represented by R$_{11}$, R$_{12}$ and R$_{13}$ of formula (i) and R$_{14}$ of formula (v) are the same as those of the alkyl group and the aryl group for R$_1$ to R$_6$ of formula (1-1) or (1-2).

The aryl group represented by R$_{11}$, R$_{12}$ and R$_{13}$ of formula (i) and R$_{14}$ of formula (v) is preferably a substituted or unsubstituted aryl group having 6 to 24 ring carbon atoms.

Examples of the divalent linking group represented by L$_{11}$ to L$_{15}$ of formulae (i) to (v) include a group comprising any one of -L$_{21}$-, —O—, —C(=O)—, —C(=O)O—, —OC(=O)—, —C(=O)NR$_{15}$—, —NR$_{16}$C(=O)—, —NR$_{17}$—, —S—, and —C(=S)—, and a group wherein two or more of these linking groups are bonded to each other in an arbitrary order.

L$_{21}$ represents a linking group selected from the group consisting of a substituted or unsubstituted arylene group having 6 to 24 ring carbon atoms, a substituted or unsubstituted divalent heterocyclic group having 3 to 24 ring atoms, a substituted or unsubstituted, linear or branched alkylene group having 1 to 20 carbon atoms, a substituted or unsubstituted vinylene group, a substituted or unsubstituted vinylidene group, and an ethynylene group, or a linking group wherein two or more groups selected from the above groups are bonded to each other in an arbitrary order.

L$_{21}$ is preferably a linking group comprising a substituted or unsubstituted, linear or branched alkylene group having 3 to 12 carbon atom, because such a linking group L$_{21}$ increases the solubility of the polymer compound of the invention to a solvent for coating.

Each of R$_{15}$ to R$_{17}$ is independently selected from the group consisting of a hydrogen atom, a substituted or unsubstituted, linear or branched alkyl group having 1 to 20 carbon atoms, and a substituted or unsubstituted aryl group having 6 to 30 ring carbon atoms.

Preferably, each of R$_{15}$ to R$_{17}$ is independently selected from the group consisting of a hydrogen atom, a substituted or unsubstituted, linear or branched alkyl group having 1 to 20 carbon atoms, and a substituted or unsubstituted aryl group having 6 to 24 ring carbon atoms.

When each of L$_{11}$ to L$_{15}$ is the linking group mentioned above, the solubility of the polymer compound of the invention to a solvent for coating is increased. In addition, the rate of polymerization is increased to reduce the non-reacted polymerizable group in the polymer compound, thereby improving the durability and lifetime of an organic device, particularly an organic electroluminescence device.

Examples of the polymer compound of the invention are shown below, although not limited thereto.

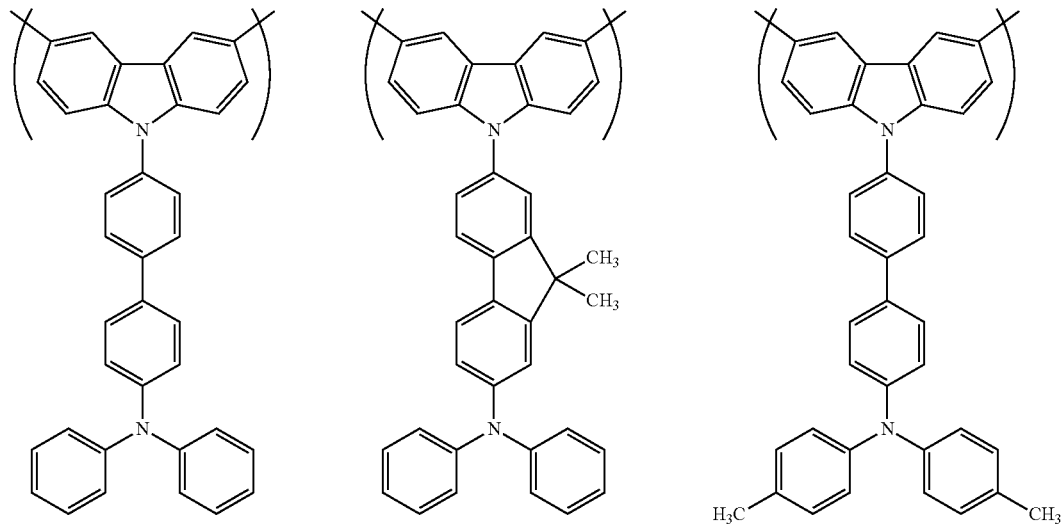

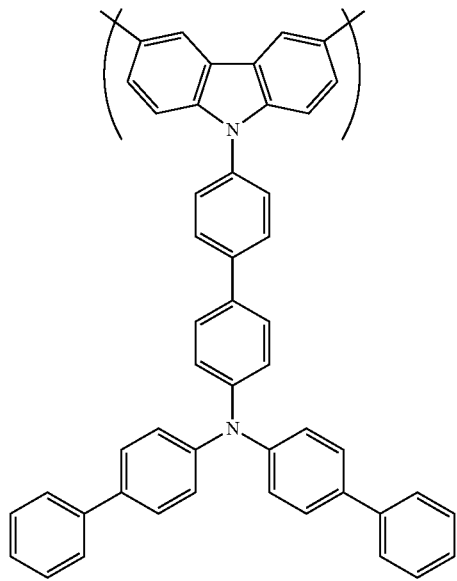
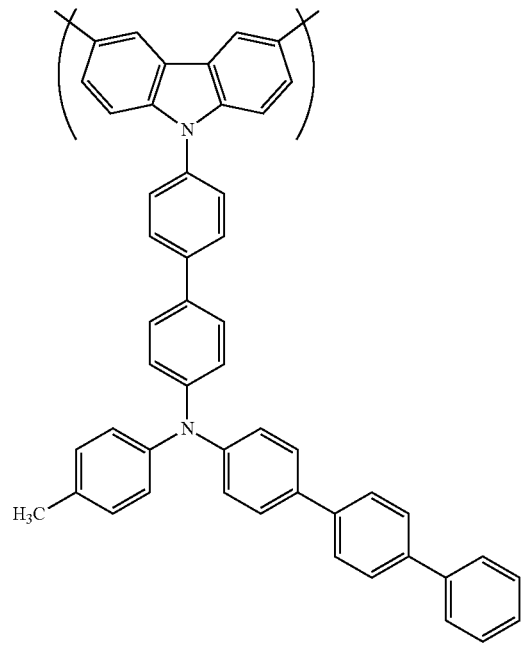
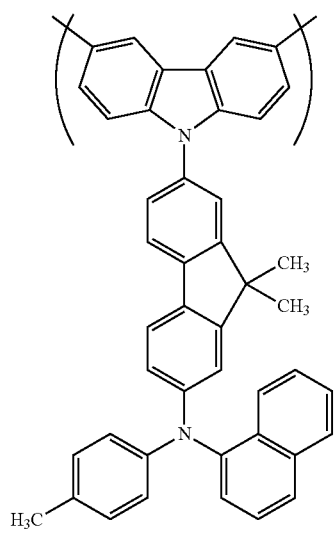
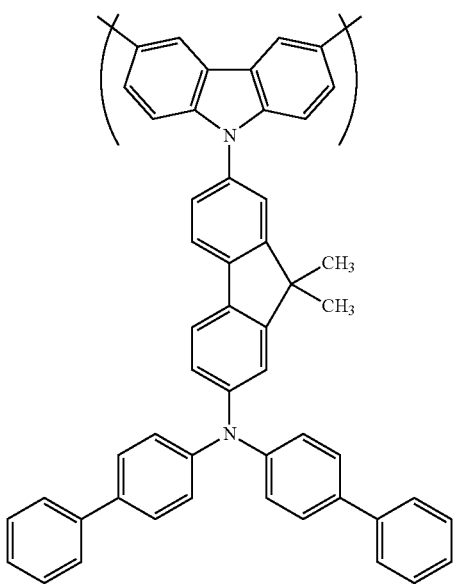

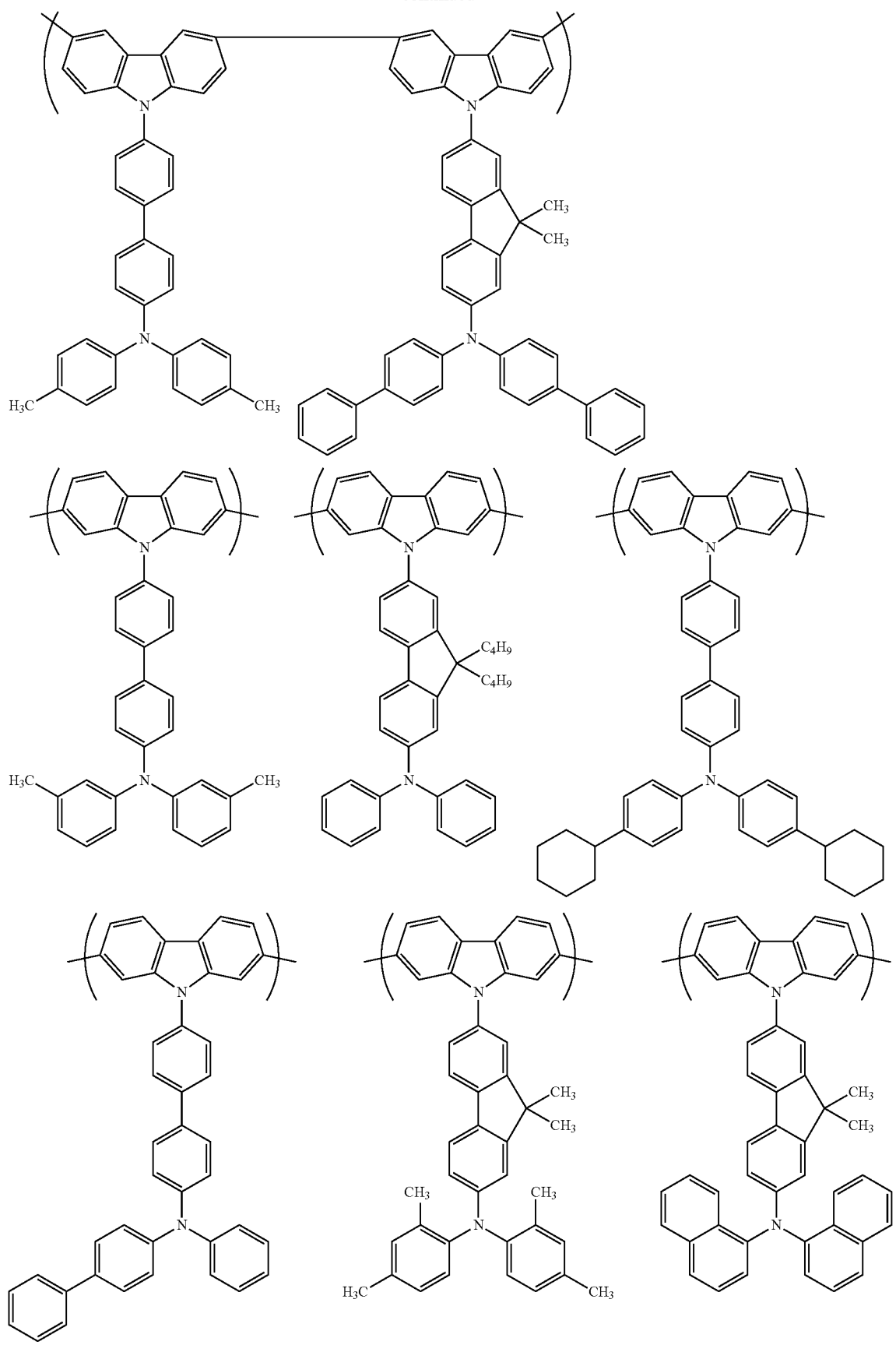

-continued
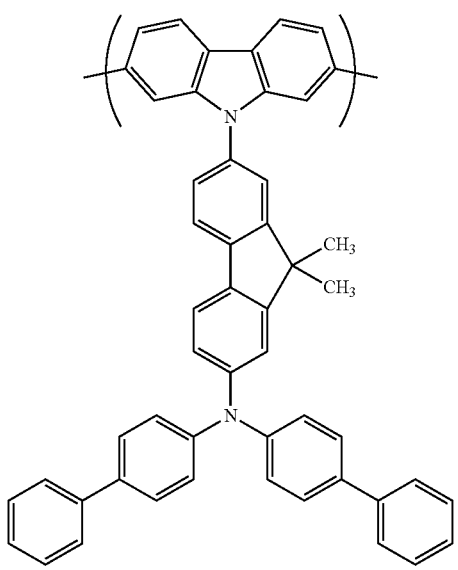
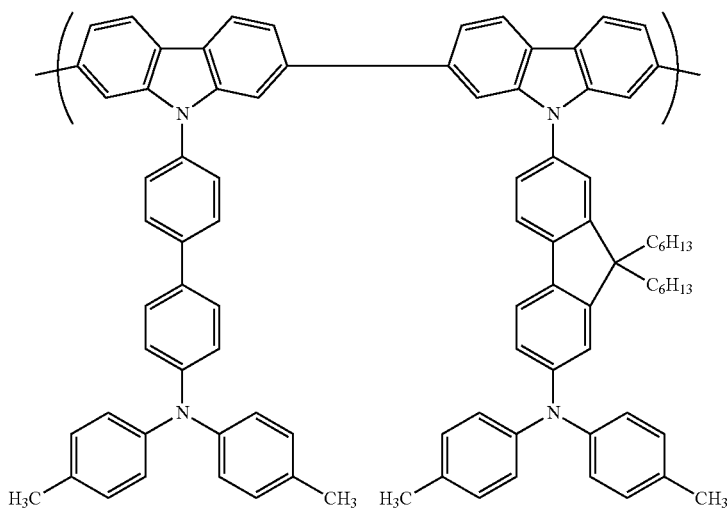
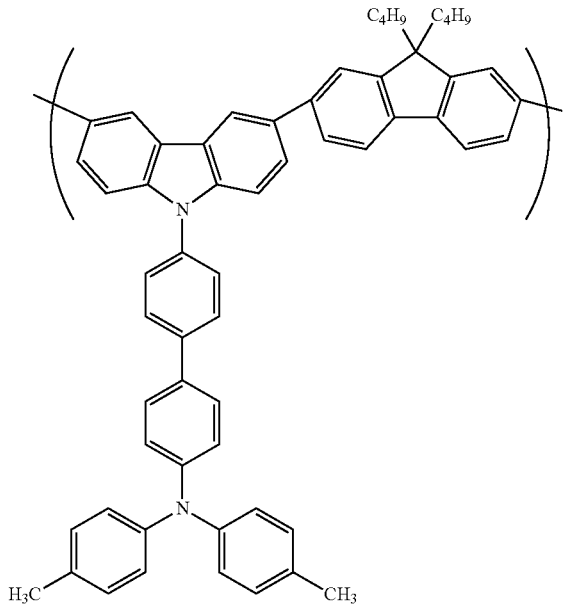
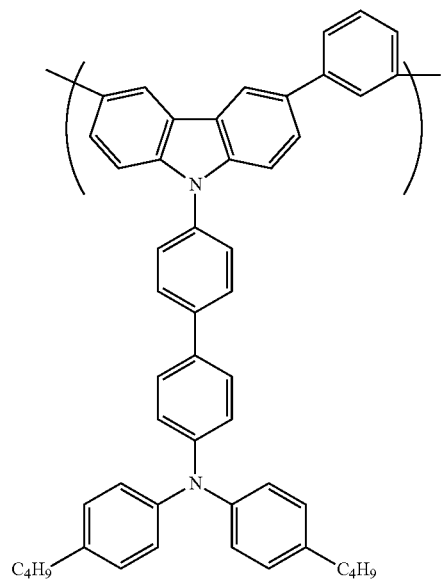

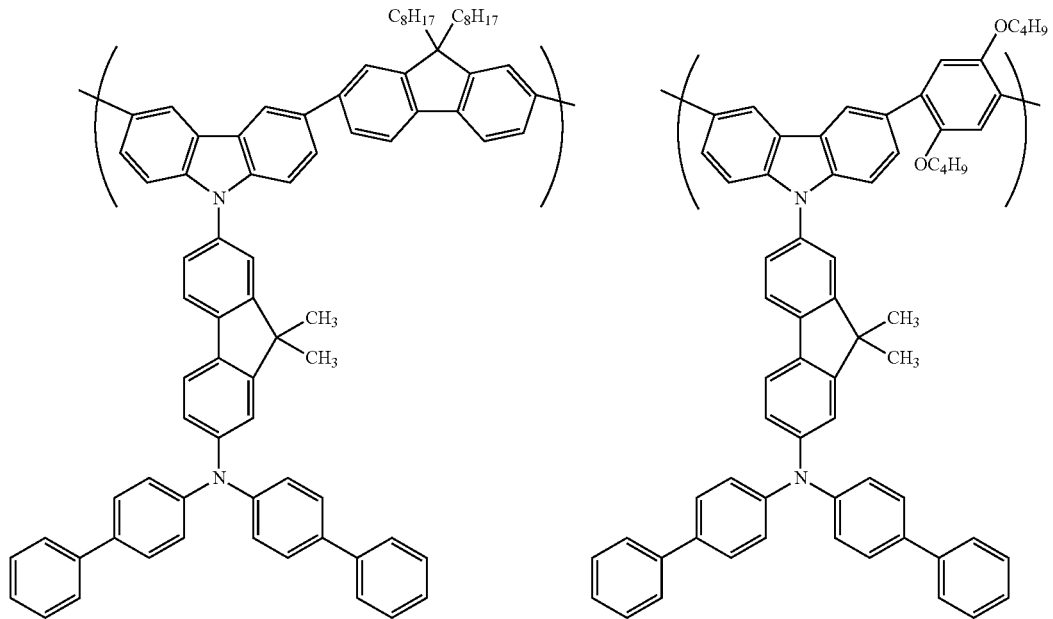
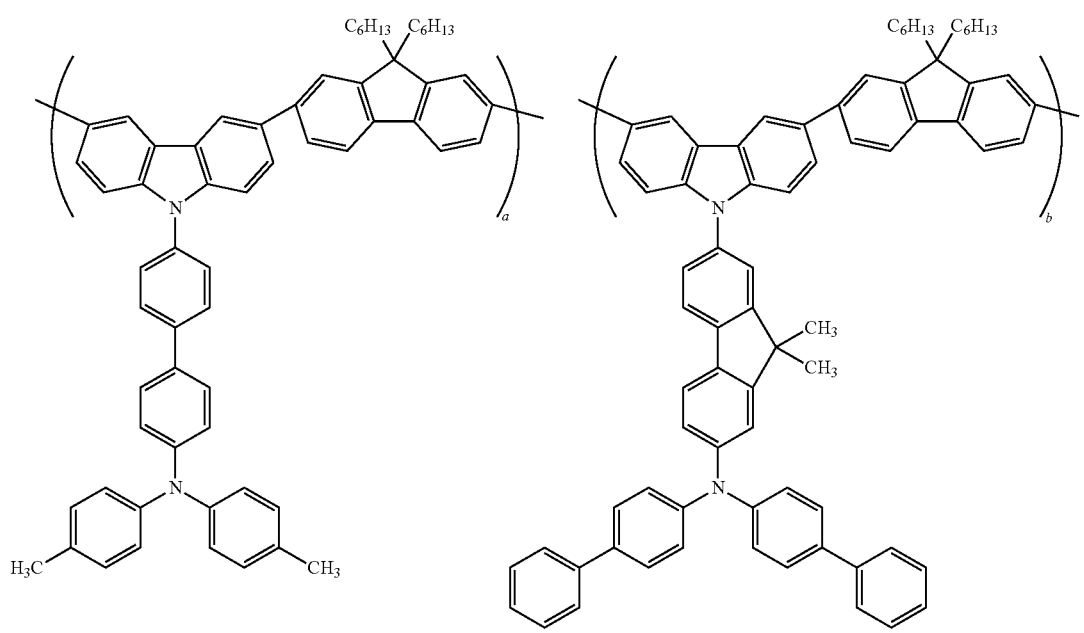
a:b = 0.5:0.5

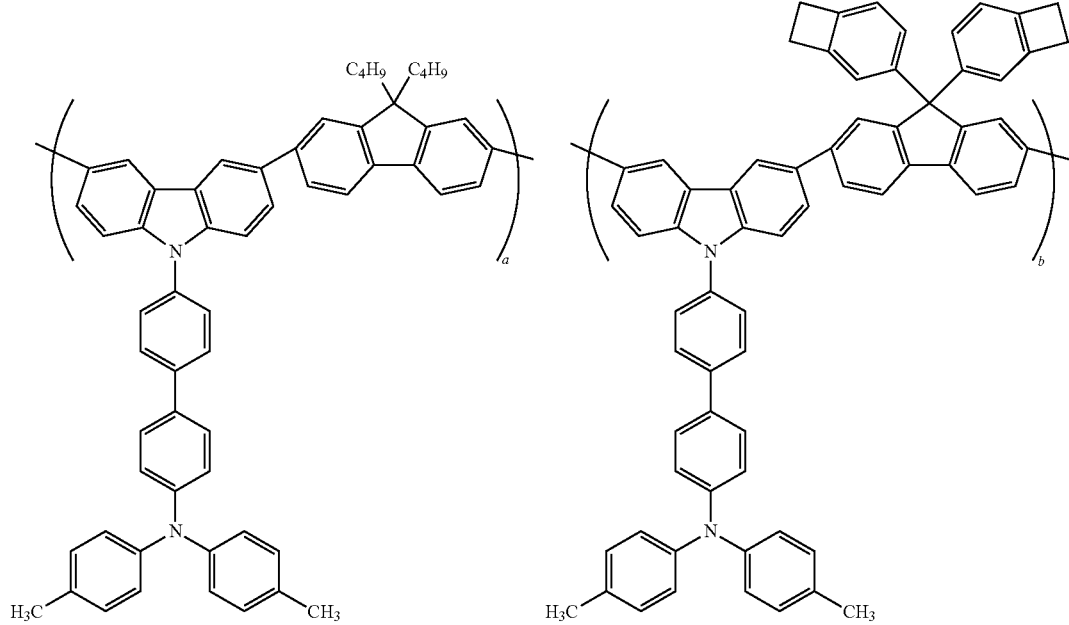
a:b = 0.9:0.1
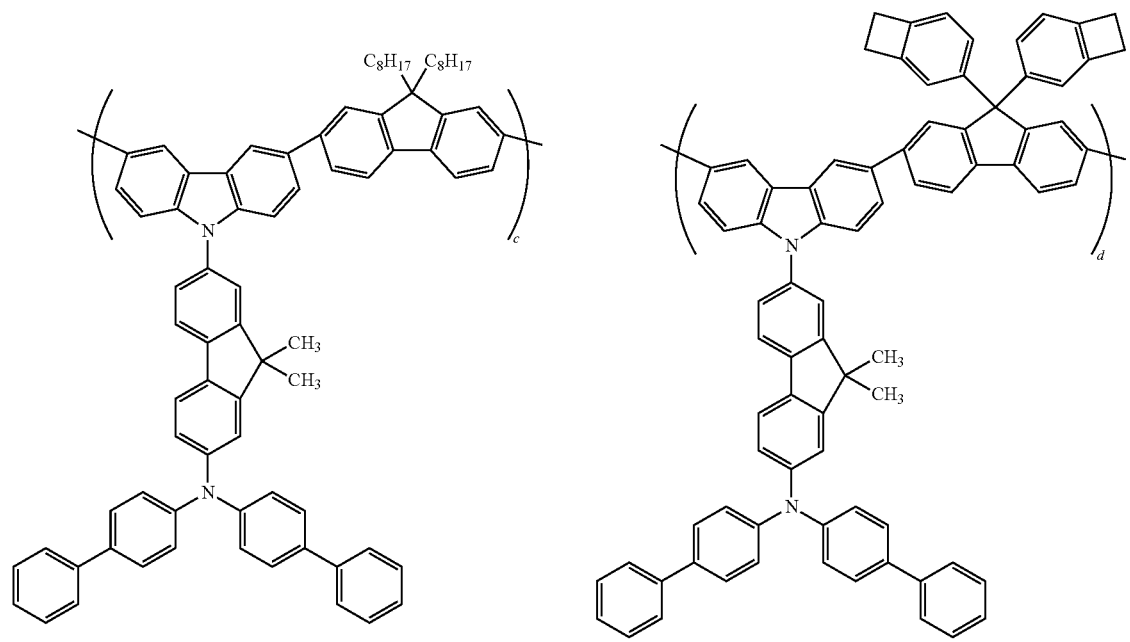
c:d = 0.8:0.2

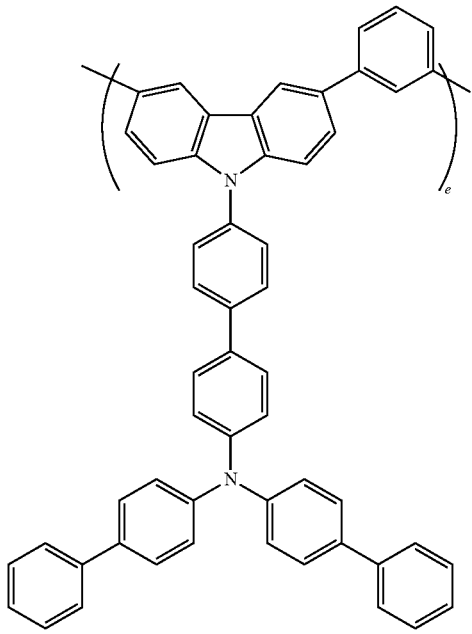
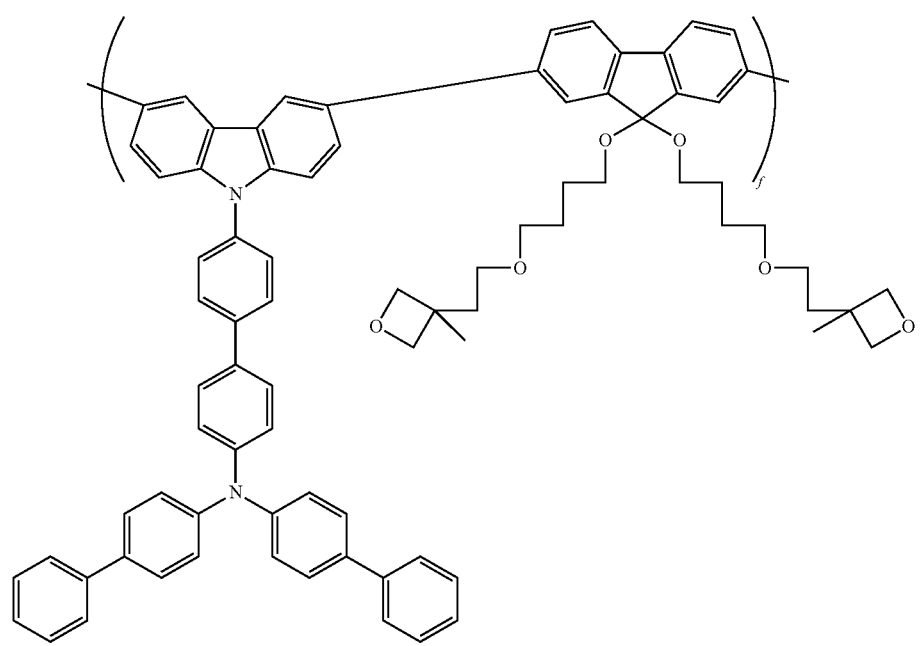
e:f = 0.9:0.1

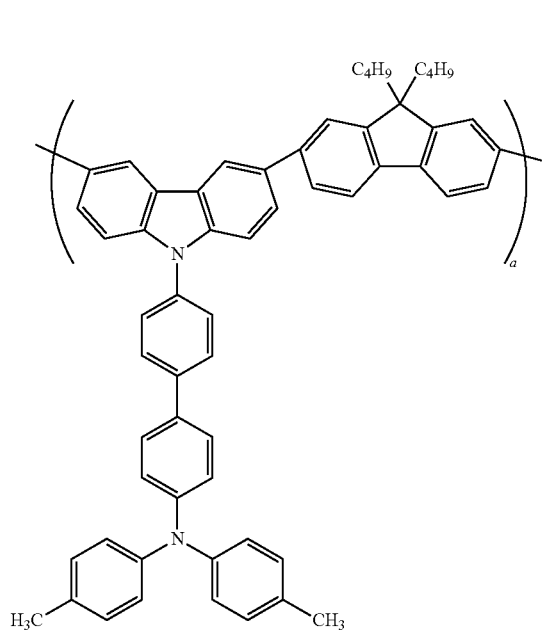
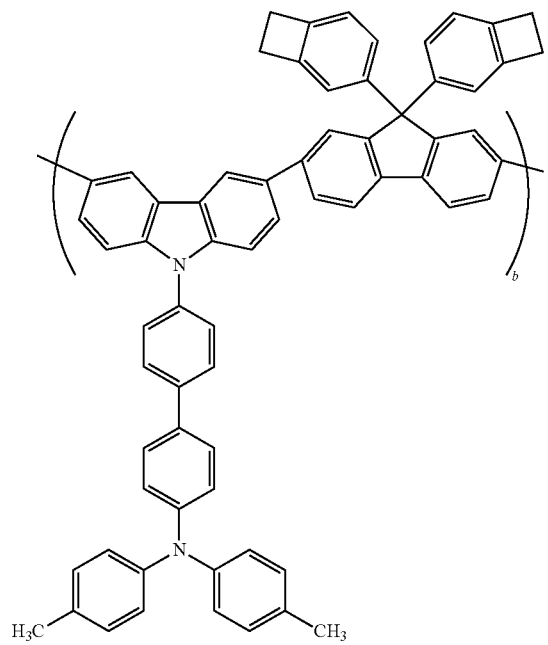
a:b = 0.9:0.1
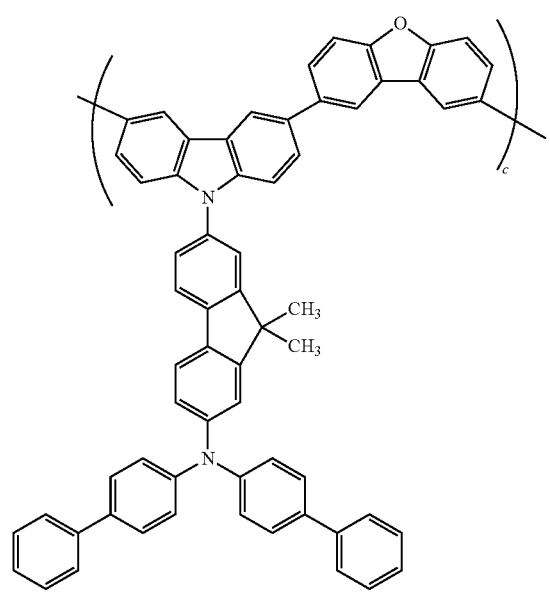
c:d = 0.8:0.2
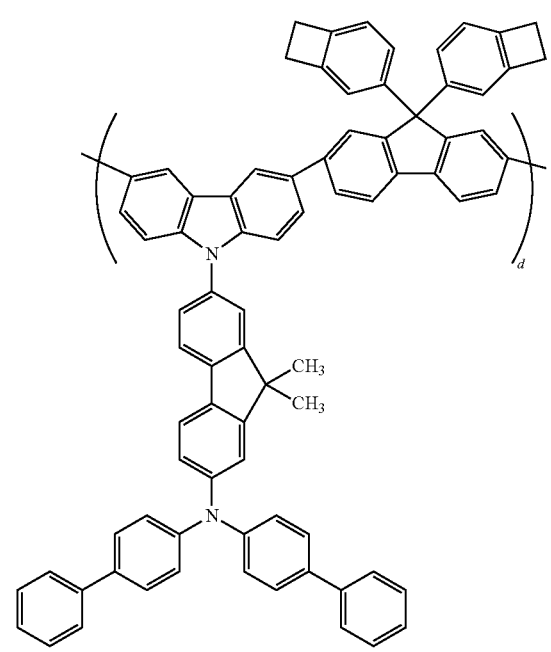

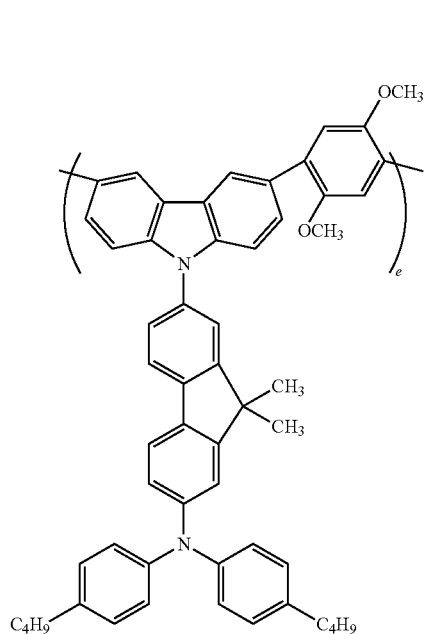
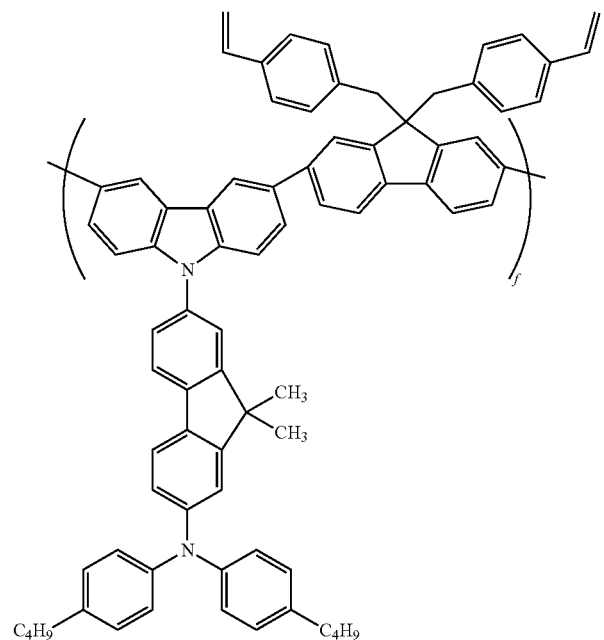
e:f = 0.8:0.2
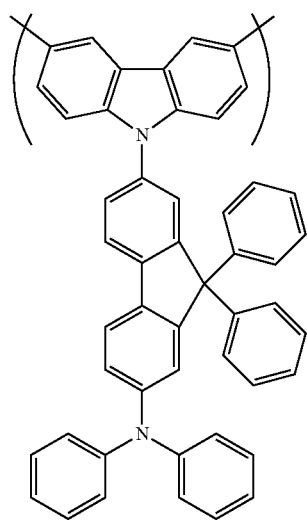
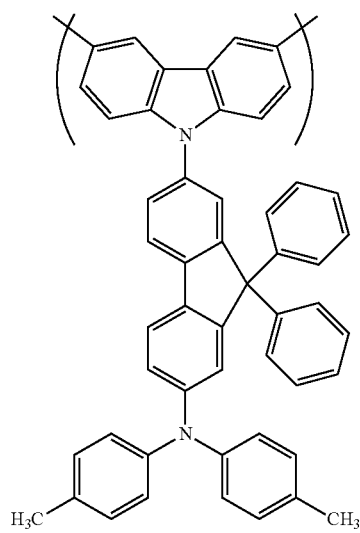

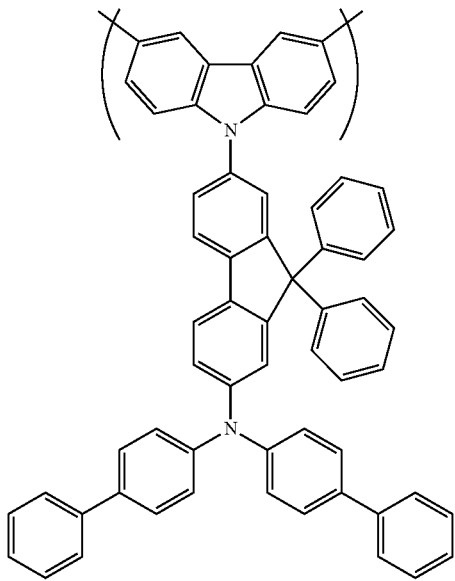
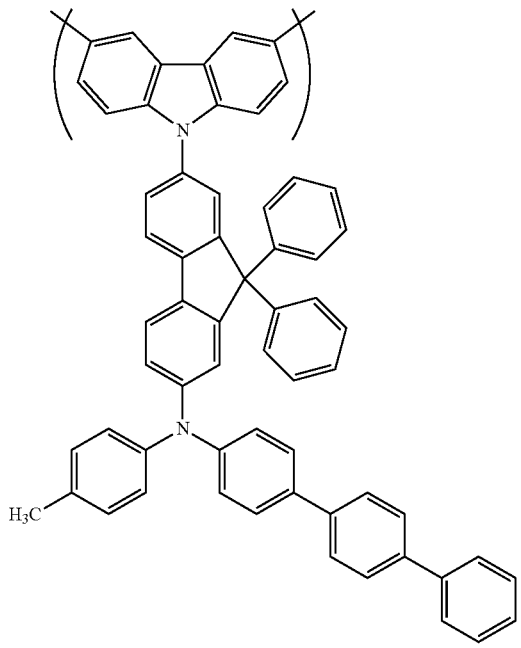
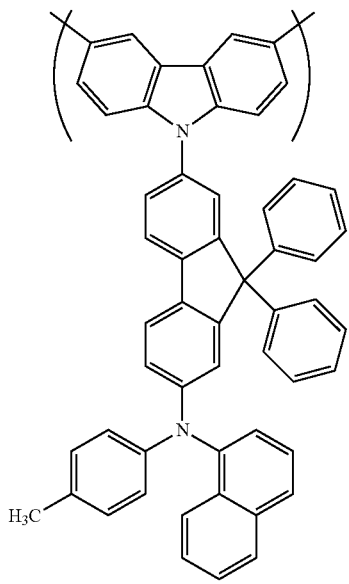
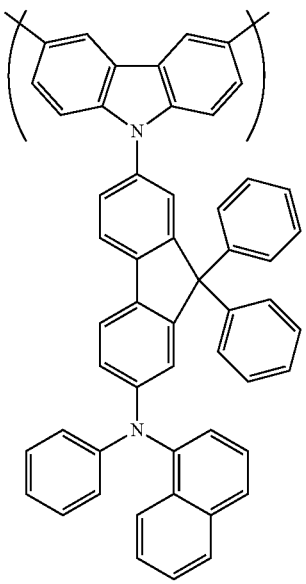

-continued
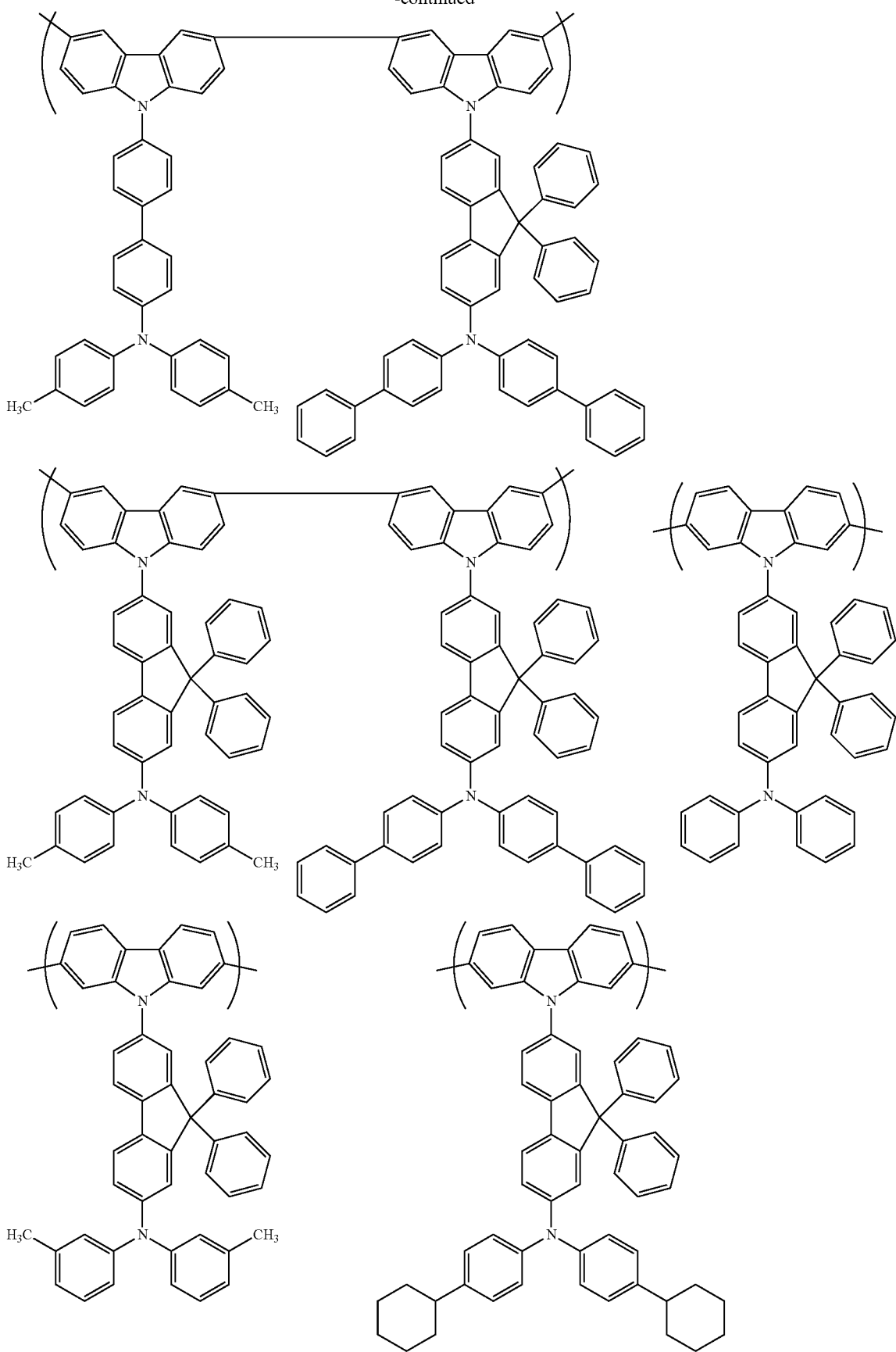

-continued
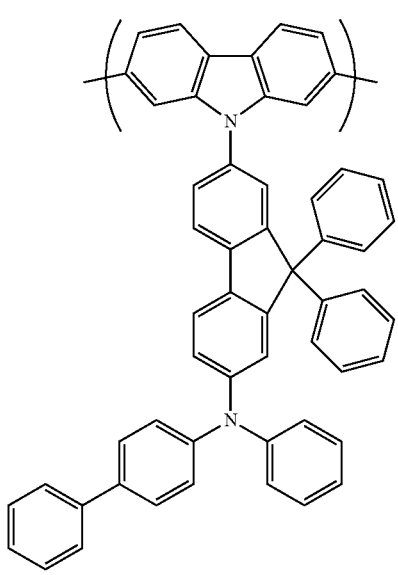
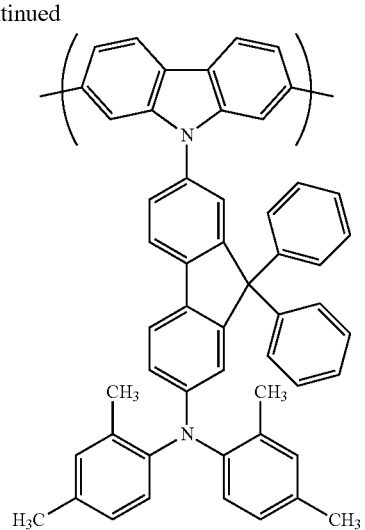
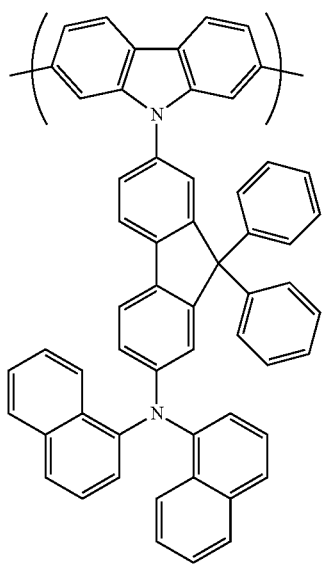
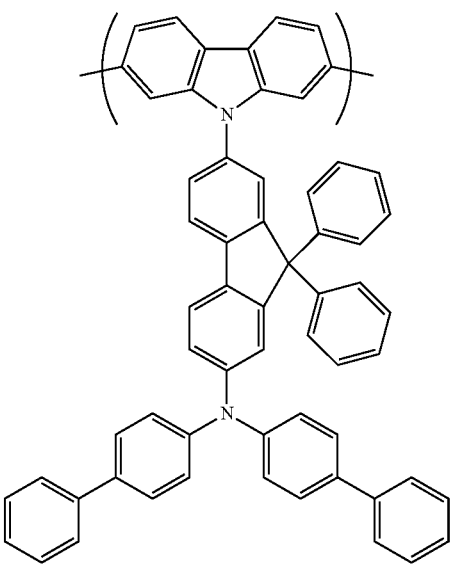
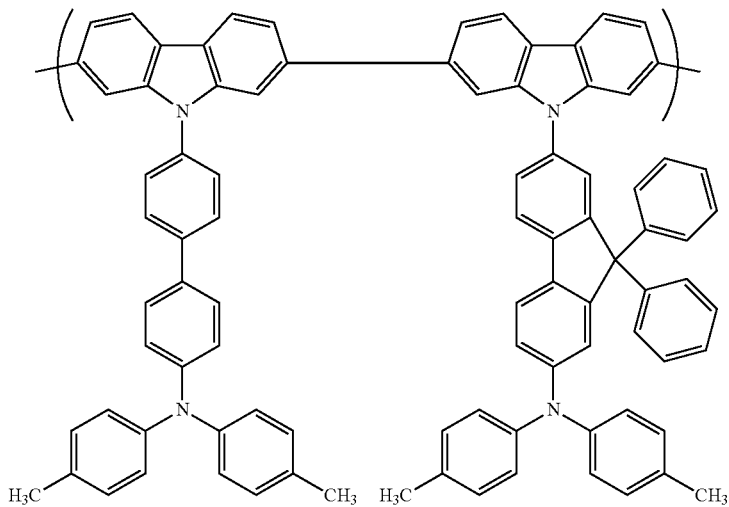

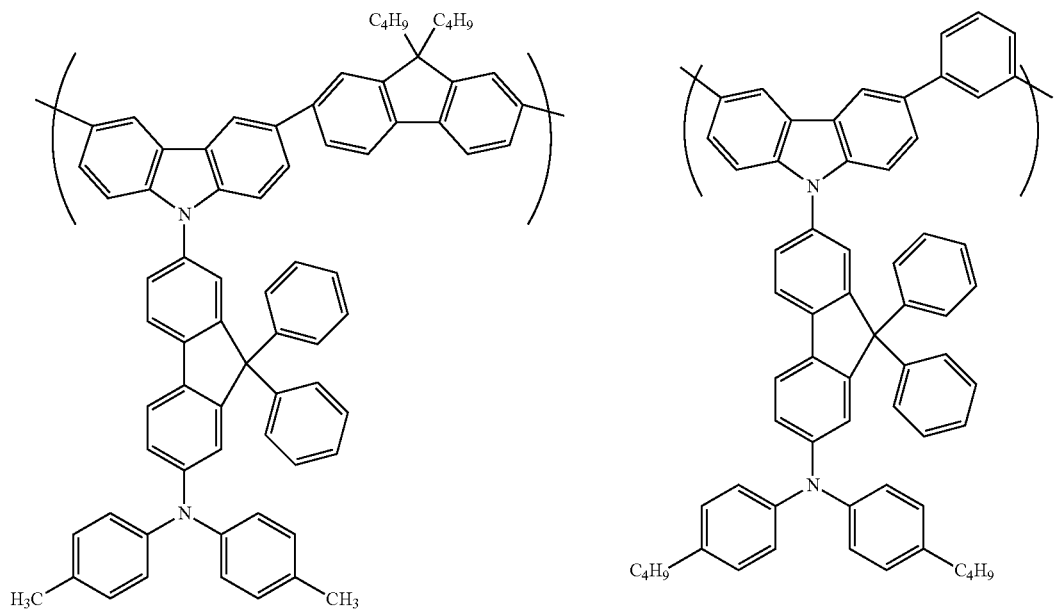
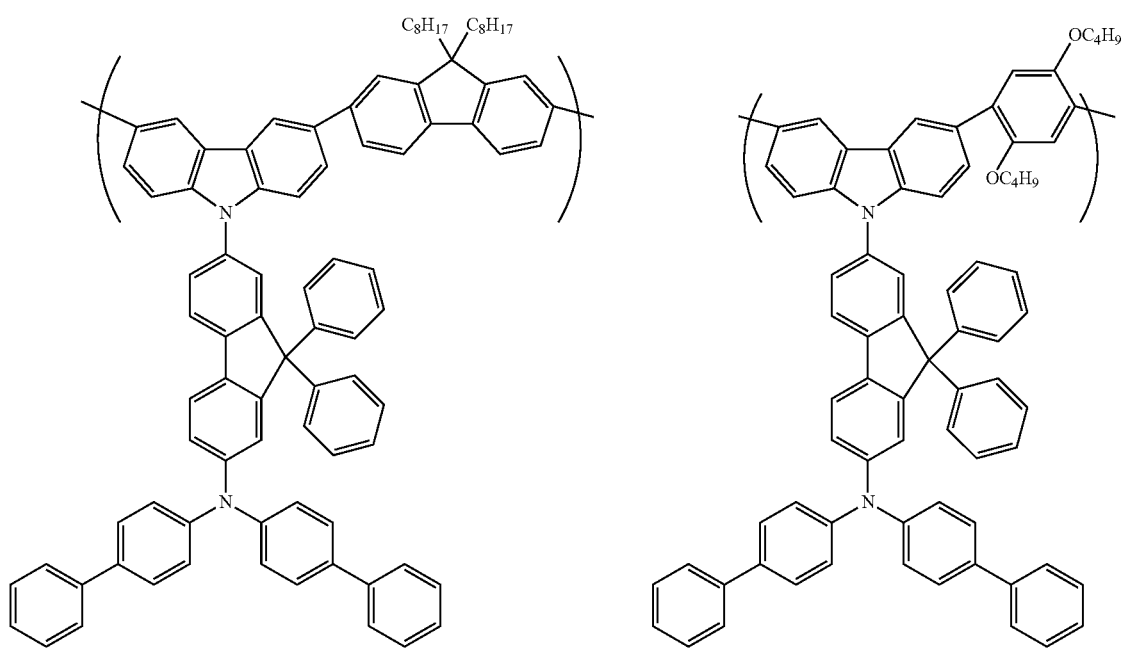

-continued
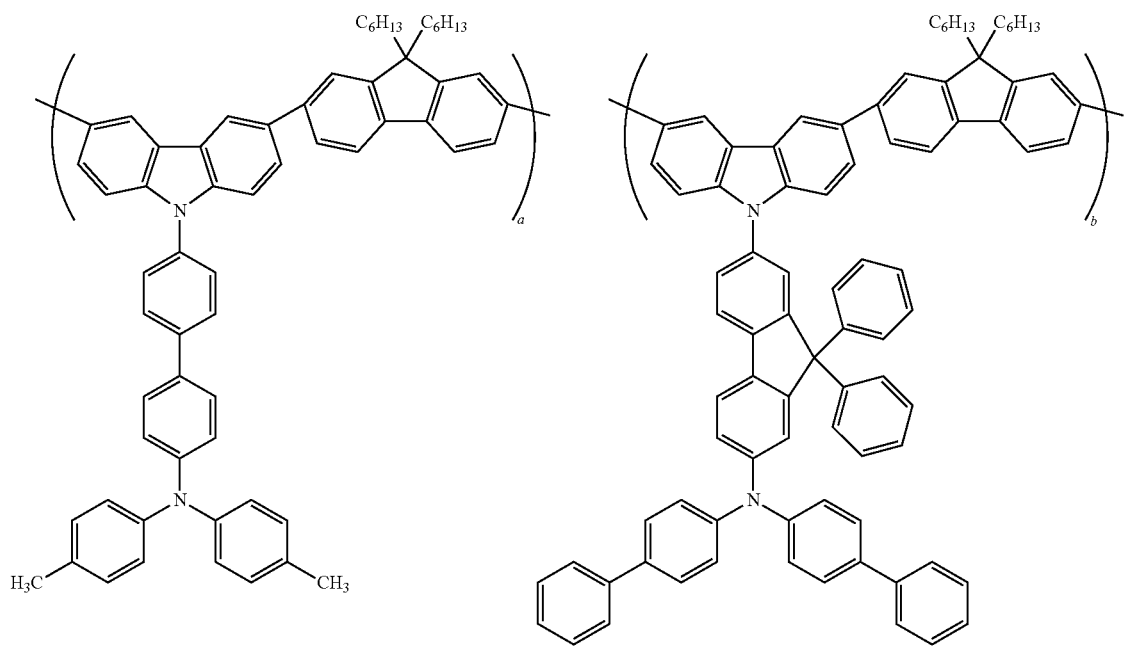
a:b = 0.5:0.5
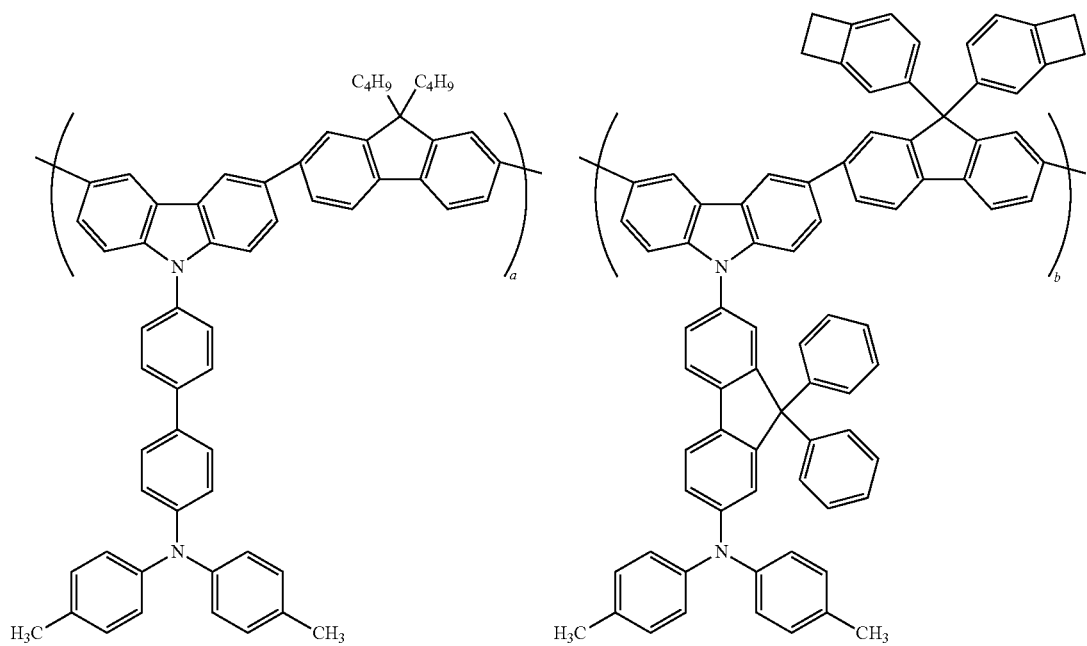
a:b = 0.9:0.1

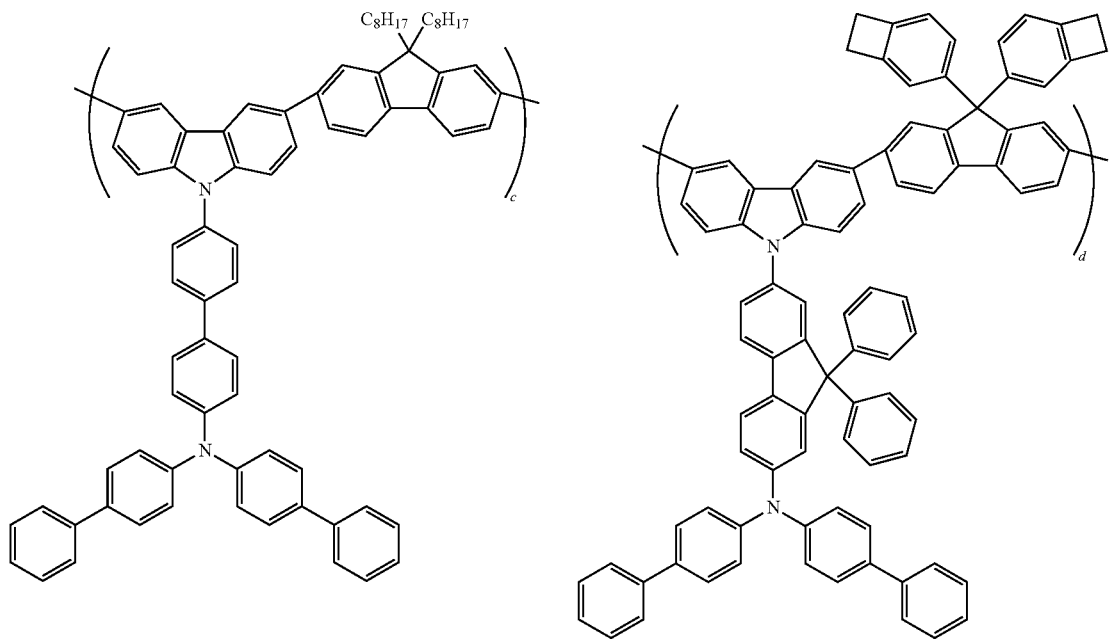
c:d = 0.8:0.2
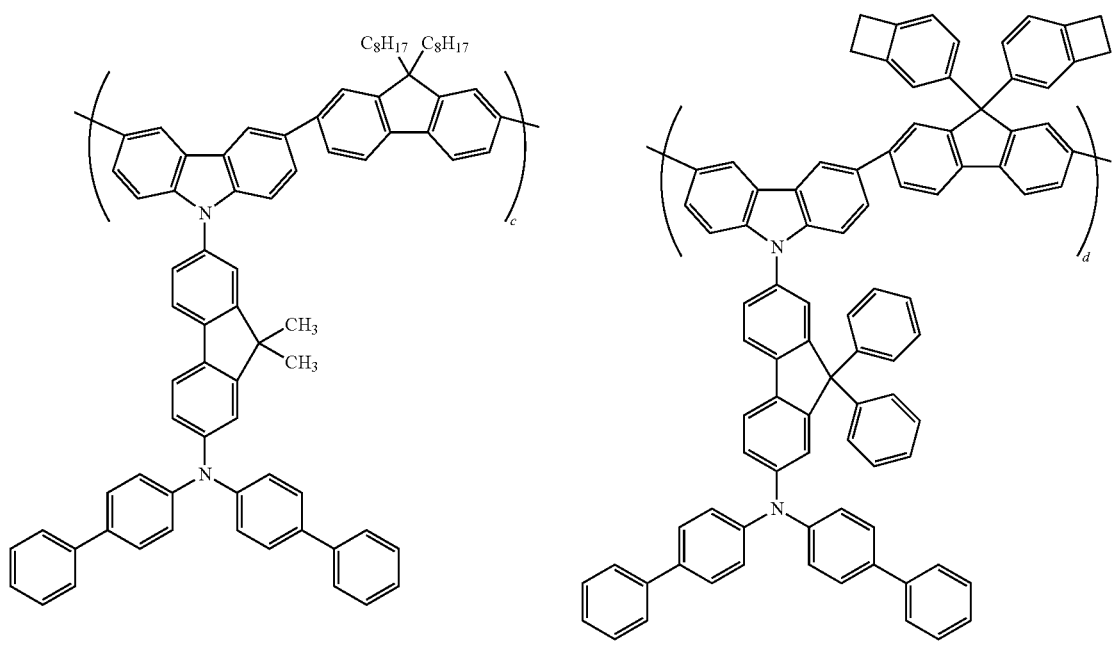
c:d = 0.8:0.2

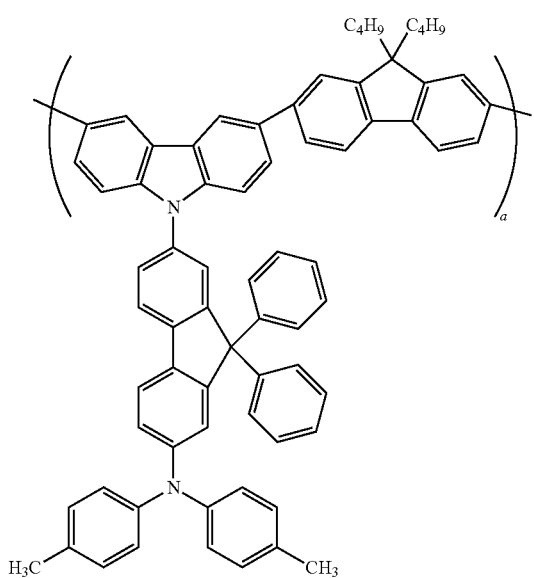
a:b = 0.9:0.1
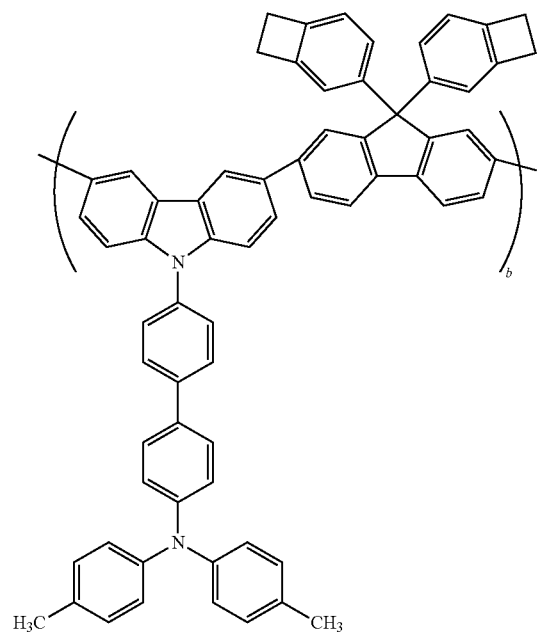
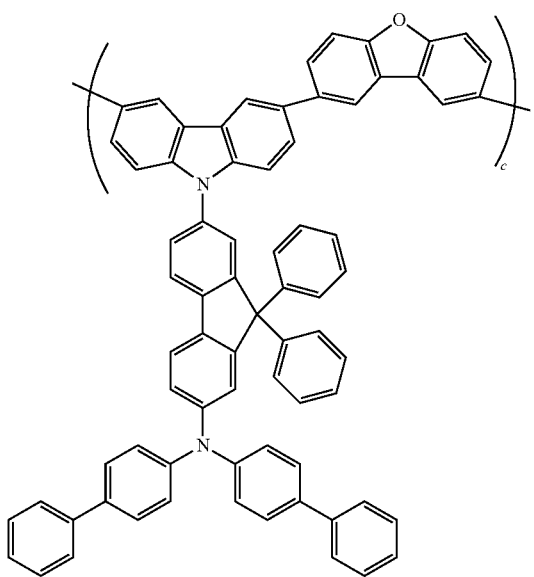
c:d = 0.8:0.2
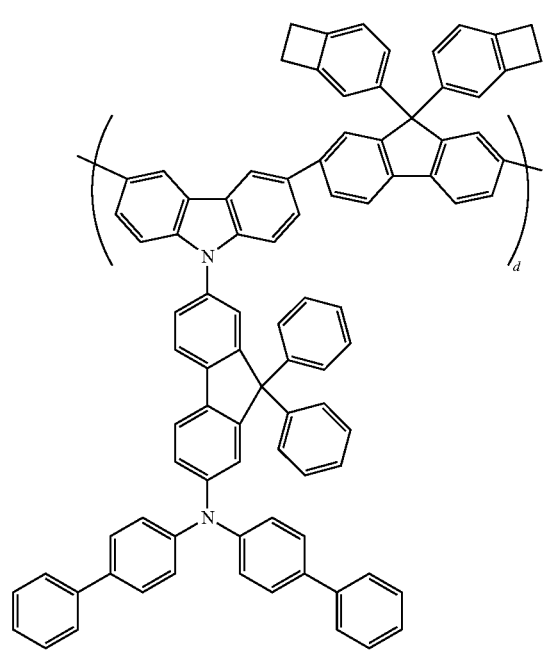

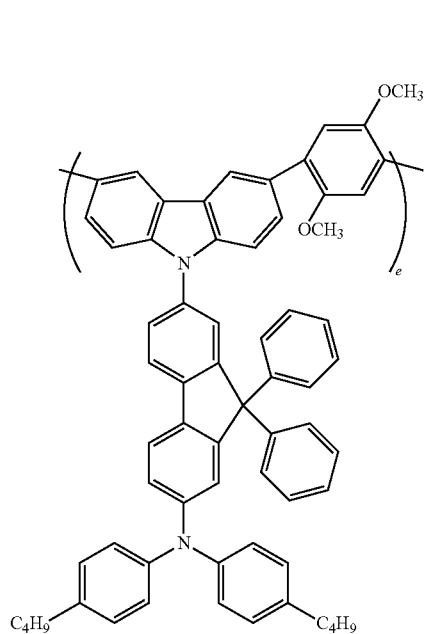
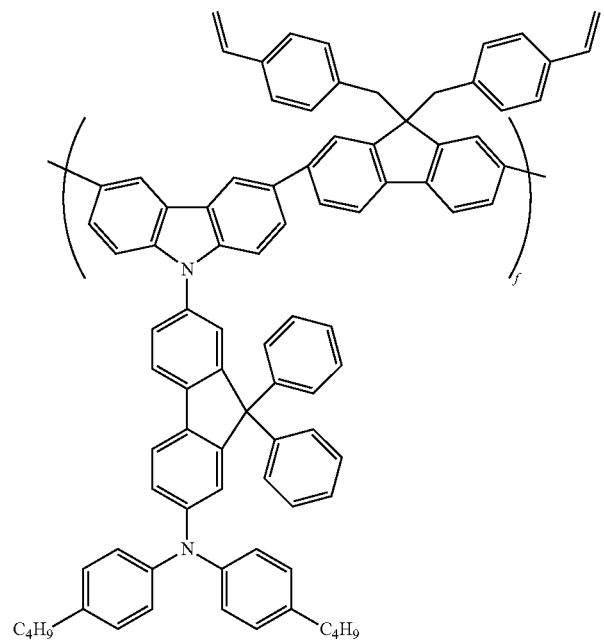
e:f = 0.8:0.2
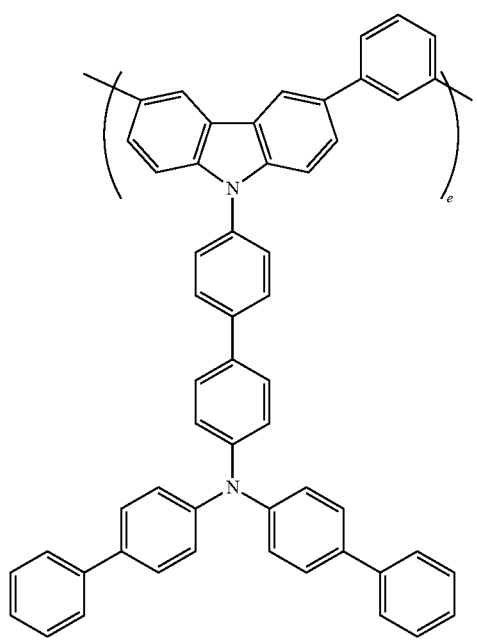

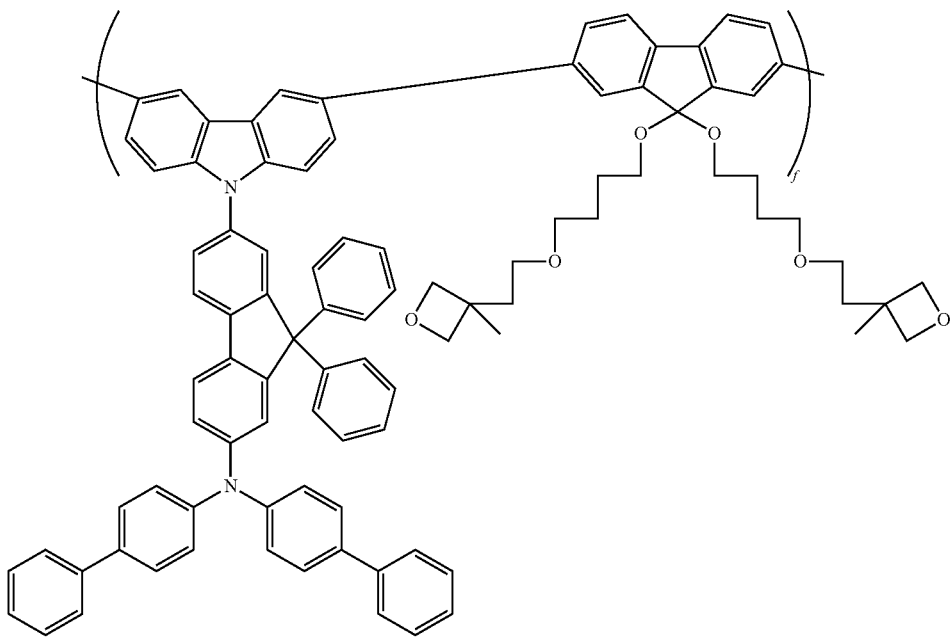

e:f = 0.9:0.1

The number average molecular weight (Mn) of the polymer compound of the invention which is determined by using a polystyrene calibration is generally $1\times10^3$ to $1\times10^8$ and preferably $1\times10^3$ to $1\times10^6$. The weight average molecular weight (Mw) is generally $1\times10^3$ to $1\times10^8$ and preferably $1\times10^3$ to $1\times10^6$. The molecular weight distribution represented by Mw/Mn is preferably 10 or less and more preferably 5 or less, although not particularly limited thereto. If the number average molecular weight (Mn) determined by using a polystyrene calibration is less than $1\times10^3$, the thin film formed is brittle. On the other hand, if exceeding $1\times10^8$, the solubility is decreased.

The polymer compound of the invention may be made into an organic thin film by using a solvent. Examples of the solvent include a chlorine-containing solvent, such as chloroform, methylene chloride, and 1,2-dichloroethane; an ether solvent, such as dibutyl ether, tetrahydrofuran, and dioxane; an aromatic solvent, such as toluene, xylene, mesitylene, tetralin, and n-butylbenzene. These organic solvents may be used alone or in combination of two or more. The polymer compound of the invention can be dissolved in these solvents in a concentration of 0.1% by weight or more, although depending upon the structure and the molecular weight of the polymer compound.

Production Method

The production method of the polymer compound of the invention will be described below.

The polymer compound of the invention may be produced, for example, by an oxidation polymerization in the presence of $FeCl_3$, the Yamamoto reaction in which an aromatic dihalogenated compound and a nickel(0) catalyst are stoichiometrically used, or the Suzuki reaction in which an aromatic dihalogenated compound and a compound having two boronic acid groups are polymerized in the presence of a palladium(0) catalyst.

The oxidation polymerization may cause a problem in some cases, for example, the bonding positions of the polymer backbone are difficult to control thereby likely to cause a structural defect, and the molecular weight is also difficult to control.

In the Suzuki reaction, the reaction is allowed to proceed in the presence of a catalyst, for example, palladium [tetrakis(triphenylphosphine)], palladium acetate, dichlorobis(triphenylphosphine) palladium(II) together with an inorganic base, such as potassium carbonate, sodium carbonate and barium hydroxide; an organic base, such as triethylamine; or a inorganic salt, such as cesium fluoride. The inorganic base, organic base or inorganic salt is added in one equivalent or more, preferably 1 to 20 equivalents per one equivalent of the monomer. Examples of the reaction solvent include N,N-dimethylformamide, toluene, dimethoxyethane, and tetrahydrofuran. An aqueous solution of the base may be added so as to carry out the reaction in a two-phase solvent. In the two-phase reaction, a phase transfer catalyst, such as a quaternary ammonium salt, may be added, if necessary. The reaction is preferably carried out at about 50 to 160° C., although depending upon the solvent to be used. The reaction may be carried out under refluxing while heating the reaction system to near the boiling point of the solvent. The reaction time is about 0.5 to 200 h. It is recommended to carry out the reaction in an inert atmosphere, such as argon gas and nitrogen gas, under the condition not to deactivate the catalyst.

Examples of the palladium catalyst for the Suzuki reaction include palladium [tetrakis(triphenylphosphine)], palladium acetate, and dichlorobis(triphenylphosphine) palladium(II).

The amount of the palladium catalyst to be added in the Suzuki reaction is not particularly limited and may be a catalytically effective amount, generally 0.0001 to 0.5 mol and preferably 0.0003 to 0.1 mol, each based on one mole of the compound to be used.

When the palladium acetate is used in the Suzuki reaction as a palladium catalyst, a phosphorus compound, for example, triphenylphosphine, tri(o-tolyl)phosphine, and tri (o-methoxyphenyl)phosphine, may be added as a ligand. The amount of the ligand to be added is generally 0.5 to 100 mol, preferably 0.9 to 20 mol, and more preferably 1 to 10 mol, each based on one mole of the palladium catalyst.

The base for use in the Suzuki reaction may be an inorganic base, an organic base and an inorganic salt. Examples of the inorganic base include potassium carbonate, sodium carbonate and barium hydroxide. Examples of the organic base include triethylamine and tributylamine. Example of the inorganic salt includes cesium fluoride.

The amount of the base to be used in the Suzuki reaction is generally 0.5 to 100 mol, preferably 0.9 to 30 mol, and more preferably 1 to 20 mol, each based on one mole of the compound to be used.

The Suzuki reaction is generally carried out in a solvent. Examples of the polymerization solvent include, but not limited, an aromatic hydrocarbon solvent, such as toluene, xylene and chlorobenzene; a halogenated hydrocarbon solvent, such as methylene chloride, dichloroethane and chloroform; an ether solvent, such as tetrahydrofuran and dioxane; an amide solvent, such as N,N-dimethylformamide; an alcohol solvent, such as methanol; an ester solvent, such as ethyl acetate; and a ketone solvent, such as acetone. By selecting the solvent, a homogeneous solution polymerization and a precipitation polymerization in which the polymer being formed is precipitated can be employed. These solvents may be used alone or in combination of two or more.

The Suzuki reaction is carried out generally at about 0 to 200° C. and preferably at 40 to 120° C. in view of increasing the molecular weight of the polymer compound, although depending upon the solvent to be used. Although depending upon the reaction conditions, such as the reaction temperature, the reaction is generally terminated when the degree of polymerization reaches the intended level, and the reaction time is preferably one hour or more and more preferably 2 to 200 h.

The Suzuki reaction is preferably carried out under an inert atmosphere, for example, under an atmosphere fully deaerated by argon gas or nitrogen gas. For example, the reaction is carried out by fully replacing the inner atmosphere of a polymerization vessel (reaction system) with nitrogen gas for deaeration; charging the compounds to be reacted and tetrakis(triphenylphosphine) palladium(0) into the polymerization vessel; again, fully replacing the inner atmosphere of the polymerization vessel with nitrogen gas for deaeration; adding a solvent, for example, toluene, which is deaerated in advance by bubbling with nitrogen gas; adding dropwise an aqueous solution of a base, for example, sodium carbonate which is deaerated in advance by bubbling nitrogen gas into the solution at 60° C.; and then, allowing the polymerization to proceed, for example, at a refluxing temperature for 30 h while keeping the inert atmosphere.

Application

The polymer compound of the invention can be used as a material for organic EL devices. Particularly, the polymer compound can be used in a hole transporting layer or a hole injecting layer of a polymer organic electroluminescence device as a hole transporting material.

Polymer Organic Electroluminescence Device

The polymer organic electroluminescence device of the invention will be described below.

The polymer organic electroluminescence device of the invention includes electrodes comprising an anode and a cathode. One or more organic thin film layers which comprise a light emitting layer are disposed between the electrodes. At least one organic thin film layer comprises at least one polymer compound of the invention alone or in combination with another material.

Preferably, the organic thin film layer of the polymer organic electroluminescence device of the invention comprises a charge transporting layer and/or a charge injecting layer (the charge transporting layer and the charge injecting layer are also collectively called "charge injection transport layer") and the charge injection transport layer comprises the polymer compound of the invention. Particularly, the charge transporting layer or the charge injecting layer preferably comprises the polymer compound of the invention as a main component.

Preferably, the organic thin film layer of the polymer organic electroluminescence device of the invention comprises a hole transporting layer and/or a hole injecting layer (the hole transporting layer and the hole injecting layer are also collectively called "hole injection transport layer") as the charge injection transport layer, and these layers comprise the polymer compound of the invention. Particularly, the hole transporting layer or the hole injecting layer preferably comprises the polymer compound of the invention.

The organic thin film layer of the polymer organic electroluminescence device of the invention may comprise an electron transporting layer and/or an electron injecting layer (the electron transporting layer and the electron injecting layer are also collectively called "electron injection transport layer") as the charge injection transport layer. The electron injection transport layer may be a layer comprising the polymer compound of the invention or may be a layer comprising an electron injecting compound other than the polymer compound of the invention. Particularly, the polymer compound of the invention is preferably included in the electron transporting layer or the electron injecting layer as a main component.

The light emitting layer in the polymer organic electroluminescence device of the invention may comprise a light emitting compound other than the polymer compound of the invention.

The device structure of the polymer organic electroluminescence device of the invention will be described below. The device structures (a) to (e) are shown below as representative structures of the organic electroluminescence device of the invention:

(a) anode/light emitting layer/cathode,
(b) anode/hole injecting layer/light emitting layer/cathode,
(c) anode/light emitting layer/electron transporting layer/cathode,
(d) anode/hole transporting layer/light emitting layer/electron transporting layer/cathode, and
(e) anode/hole injecting layer/hole transporting layer/light emitting layer/electron transporting layer/cathode.

Of the above device structures, the structure (e) is preferably used, although not limited thereto. In the above device structures, "/" means that the layers of both sides are adjacently laminated.

The organic thin film layer may be formed by any of known methods, for example, formed by using a solution. Examples of the film-forming method using a solution include a spin coating method, a casting method, a microgravure coating method, a gravure coating method, a bar coating method, a roll coating method, a wire bar coating method, a dip coating method, a spray coating method, a nozzle coating method, a capillary coating method, a screen printing method, a flexo printing method, an offset printing method, and an inkjet printing method. When a patterned layer is intended, a screen printing method, a flexo printing method, an offset printing method, and an inkjet printing method are preferably used.

The optimum thickness of the organic thin film layer depends upon the material to be used and may be selected so as to obtain an appropriate driving voltage and an appropriate emission efficiency. For example, the thickness is 1 nm to 1 μm, preferably 2 to 500 nm, and more preferably 5 to 200 nm.

The solvent for use in forming the film by using a solution is not particularly limited as long as the solvent dissolves the organic material for constituting the organic thin film layer. Examples thereof include a chlorine-containing solvent, such as chloroform, methylene chloride and dichloroethane; an ether solvent, such as tetrahydrofuran; an aromatic hydrocarbon solvent, such as toluene and xylene; a ketone solvent, such as acetone and methyl ethyl ketone, and an ester solvent, such as ethyl acetate, butyl acetate and ethyl cellosolve acetate.

In the polymer organic electroluminescence device of the invention, at least one electrode selected from the anode and the cathode is transparent or semi-transparent, with the anode being preferably transparent or semi-transparent.

The material for the anode is preferably selected from an electroconductive metal oxide film and a semi-transparent metal thin film. Examples thereof include indium oxide, zinc oxide, tin oxide, an electroconductive inorganic compound comprising a composite of these oxides, such as indium-tin-oxide (ITO) and indium-zinc-oxide, gold, platinum, silver, and copper, with ITO, indium-zinc-oxide, and tin oxide being preferred. An organic material, such as polyaniline, its derivative, polythiophene, and its derivative, is also usable as the material for the anode.

The anode may be formed, for example, by a vacuum vapor deposition method, a sputtering method, an ion plating method, and a plating method.

The thickness of the anode is suitably selected by taking the light transparency and the electroconductivity into consideration, for example, 10 nm to 10 μm, preferably 20 nm to 1 μm, and more preferably 50 to 500 nm.

To facilitate the charge injection, a layer comprising a phthalocyanine derivative, an electroconductive polymer, or carbon or a layer comprising a metal oxide, a metal fluoride, or an organic insulating material may be disposed on the anode.

The material for the cathode is preferably a material having a small work function. Examples thereof include a metal, such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium; an alloy of two or more metals selected from the above metals; an alloy of at least one metal selected from the above metals and at least one metal selected from gold, silver, platinum, copper, manganese, titanium, cobalt, nickel, tungsten, and tin; and graphite or a graphite intercalation compound. Examples of the alloy include a magnesium-silver alloy, a magnesium-indium alloy, a magnesium-aluminum alloy, an indium-silver alloy, a lithium-aluminum alloy, a lithium-magnesium alloy, a lithium-indium alloy, and a calcium-aluminum alloy.

The cathode may be formed into a two or more layered structure.

The thickness of the cathode is suitably selected by taking the electroconductivity and the durability into consideration, for example, 10 nm to 10 μm, preferably 20 nm to 1 μm, and more preferably 50 to 500 nm.

The cathode may be formed, for example, by a vacuum vapor deposition method, a sputtering method, or a laminating method in which a metal thin film is press-bonded under heating.

A layer comprising an electroconductive polymer or a layer comprising a metal oxide, a metal fluoride or an organic insulating material may be disposed between the cathode and the organic layer.

After forming the cathode, a protecting member may be provided to protect a polymer luminescent device. To use a polymer luminescent device stably for a long time, it is recommended to protect the device from outside influences by providing a protecting layer and/or a protecting cover.

The protecting layer is made of a resin, a metal oxide, a metal fluoride, a metal boride, etc. The protecting cover may be a glass plate or a plastic plate having its surface subjected to a water impervious treatment. For example, a protecting cover is preferably adhered to a substrate of device via a thermoset resin or a photo-set resin for sealing. By using a spacer to provide space between a device and a protecting cover, the scratching of the device can be easily prevented. By sealing an inert gas, such as nitrogen and argon, within the space, the oxidation of the cathode can be prevented. By placing a drying agent, such as barium oxide, in the space, the damage of a device due to water adsorbed during its production can be easily prevented. It is recommended to take at least one of the above measures.

EXAMPLES

The present invention will be described in more detail with reference to the examples. It should be noted that the scope of the invention is not limited thereto. The weight average molecular weight and the number average molecular weight referred herein were determined by a gel permeation chromatography (GPC) with a polystyrene calibration, using tetrahydrofuran as a solvent for GPC.

Conditions of GPC Analysis

Apparatus: Gel permeation chromatograph GPC 101 (manufactured by Shodex)

Detector: Differential refractometer

Column: GPC K-806L×3 (8.0 mm I.D.×30 cm, manufactured by Shodex)

Column temperature: 40° C.

Solvent: Chloroform

Injection: 100 μl

Flow rate: 1 ml/min

Standard: Monodisperse polystyrene (manufactured by Shodex)

Synthesis of Intermediates
Intermediate 1
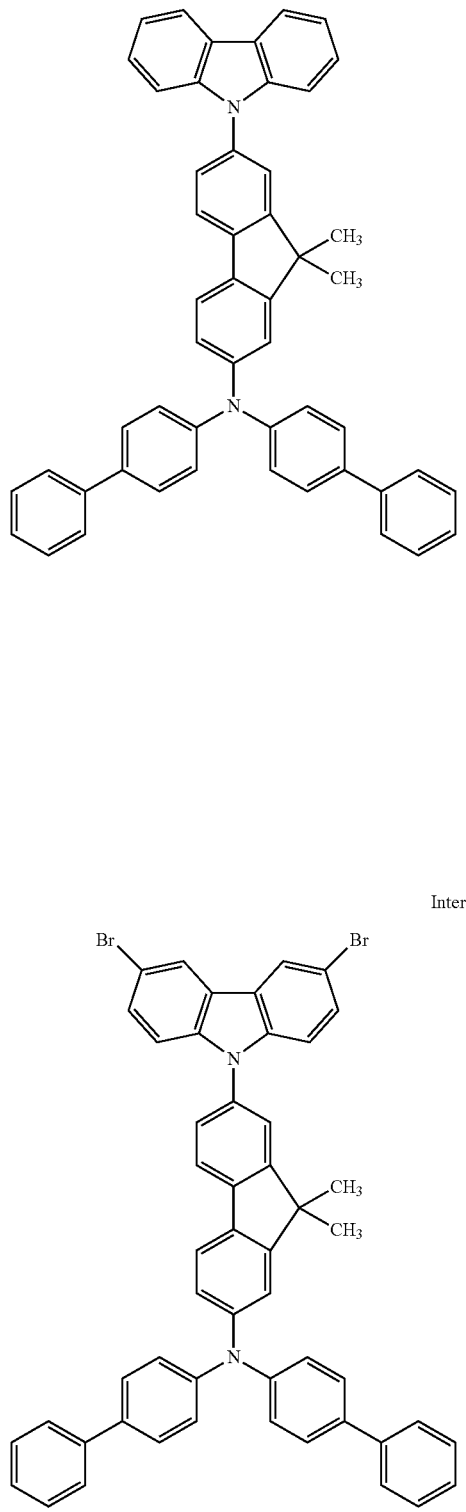
Intermediate 2
Intermediate 3
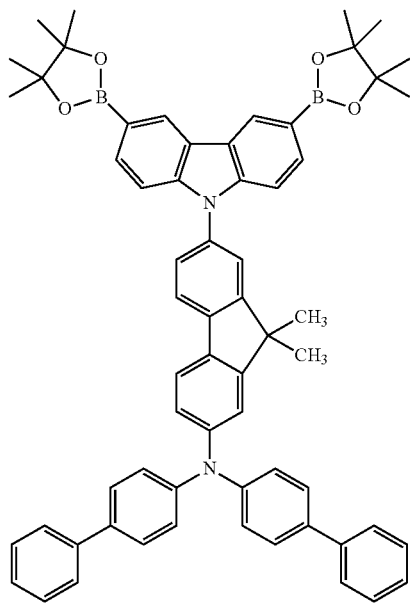
Intermediate 4
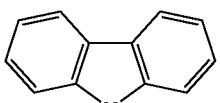
Intermediate 5
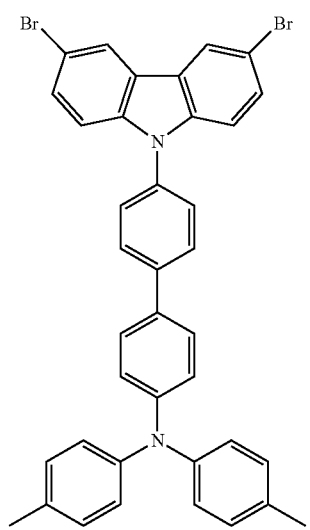

Intermediate 6

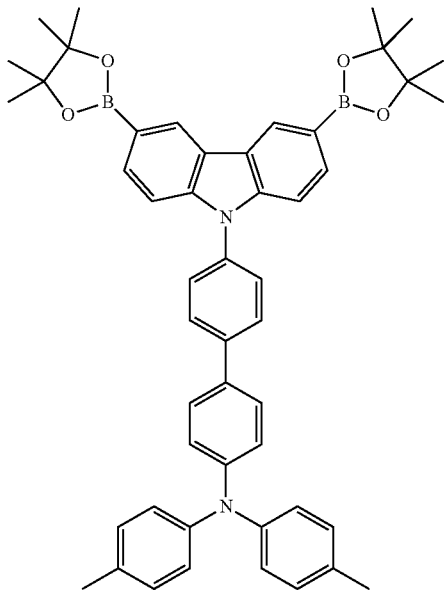

Intermediate Synthesis 1 (Synthesis of Intermediate 2)

Under nitrogen stream, the intermediate 1 (67.8 g) which was synthesized in reference to the method described in JP 2000-302756A was added to tetrahydrofuran (1500 ml), and the resultant mixture was cooled to 20° C. in an ice path. Then, a tetrahydrofuran solution of N-bromosuccinimide (NBS, 42.7 g) was added dropwise to the mixture. After the dropwise addition, the reaction was allowed to proceed at room temperature for 20 h. Then, distilled water (800 ml) was added to the mixture to precipitate the crystal. Methanol (300 ml) was added to the crystal separated by filtration. The resultant mixture was stirred at 60° C. for one hour, cooled, filtrated, and then dried. The obtained residue was recrystallized from chlorobenzene to obtain 51.1 g of a white solid, which was identified as the intermediate 2 by an FD-MS analysis.

Intermediate Synthesis 2 (Synthesis of Intermediate 3)

Under nitrogen stream, the intermediate 2 (10.0 g), bis(pinacolato)diboron (7.28 g, 0.029 mol), dehydrated 1,4-dioxane (100 ml), and potassium acetate (7.71 g) were charged into a reaction vessel, and Pd(dppf)Cl$_2$ (0.58 g) was further added. The reaction was allowed to proceed at 90° C. for 6 h. After cooling, toluene (150 ml) was added and the resultant mixture was washed with distilled water (200 ml) three times. The organic layer was passed through a silica gel short column to remove the catalyst and concentrated by removing the toluene. Thereafter, methanol (100 ml) was added and the mixture was dried to obtain 10.3 g of a solid, which was identified as the intermediate 3 by an FD-MS analysis.

Intermediate Synthesis 3 (Synthesis of Intermediate 5)

In the same manner as in Intermediate Synthesis 1 except for using 50.0 g of the intermediate 4 synthesized in reference to the method described in JP 2000-302756A in place of the intermediate 1, 42.4 g of a white solid was obtained, which was identified as the intermediate 5 by an FD-MS analysis.

Intermediate Synthesis 4 (Synthesis of Intermediate 6)

In the same manner as in Intermediate Synthesis 2 except for using 20.0 g of the intermediate 5 in place of the intermediate 2, 18.2 g of a white solid was obtained, which was identified as the intermediate 6 by an FD-MS analysis.

Example 1

Into a reaction vessel, the intermediate 2 (monomer, 4.49 g), the intermediate 3 (monomer, 5.00 g), toluene (60 ml), tetrabutylammonium bromide (0.19 g), and an aqueous solution (30 ml) of sodium carbonate (1.51 g) were charged, and the inner atmosphere was purged with nitrogen. Thereafter, tetrakis(triphenylphosphine) palladium(0) (0.12 g) was added and the reaction was allowed to proceed in a nitrogen gas atmosphere under refluxing for 40 h.

After the reaction, the reaction solution was cooled to around room temperature. Phenylboronic acid (0.0646 g) was added to the cooled reaction solution, and the reaction was further allowed to proceed under refluxing for 2 h. After the reaction, the reaction solution was cooled to around room temperature and washed with water (150 ml) three times. After washing, the toluene solution was passed through a layered column (400 ml silica gel/50 ml alumina) to remove the catalyst, concentrated under reduced pressure, and then washed with a methanol/acetone solution, thereby obtaining a polymer compound (2.72 g). The weight average molecular weight was $2.71 \times 10^4$, and the number average molecular weight was $1.05 \times 10^4$, each determined by using a polystyrene calibration.

From the starting materials used, the repeating units in the obtained polymer compound are probably represented by the following formula (polymer compound 1):

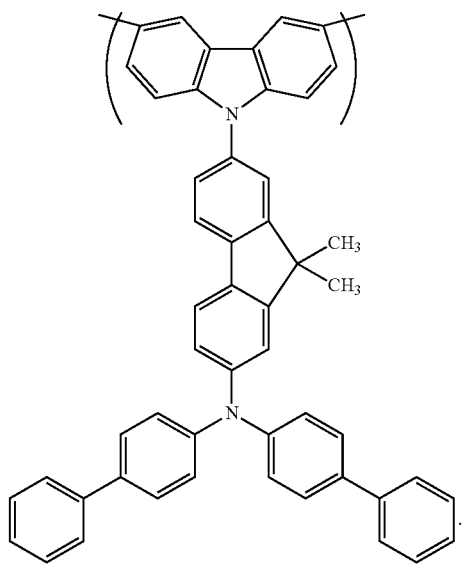

Example 2

Into a reaction vessel, the intermediate 3 (monomer, 3.35 g), a dibromide (2.00 g, manufactured by Aldrich) represented by the following formula, toluene (50 ml), tetrabutylammonium chloride (0.28 g), and an aqueous solution (25 ml) of sodium carbonate (2.24 g) were charged, and the inner atmosphere was purged with nitrogen. Thereafter, tetrakis(triphenylphosphine) palladium(0) (0.028 g) was added and the reaction was allowed to proceed in a nitrogen gas atmosphere under refluxing for 48 h.

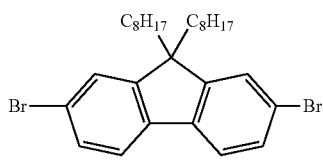

After the reaction, the reaction solution was cooled to around room temperature. Phenylboronic acid (1.0 g) was added to the cooled reaction solution, and the reaction was further allowed to proceed under refluxing for 2 h. After the reaction, the reaction solution was cooled to around room temperature and washed with water (150 ml) three times.

After washing, the toluene solution was passed through a layered column (100 ml silica gel/50 ml alumina) to remove the catalyst and concentrated under reduced pressure. Then, methanol (25 ml) was added to precipitate a solid. The solid was dissolved in 20 nil of toluene and reprecipitated in a methanol/acetone solution to obtain a polymer compound (2.6 g). The weight average molecular weight was $1.87 \times 10^5$, and the number average molecular weight was $1.78 \times 10^4$, each determined by using a polystyrene calibration.

From the starting materials used, the repeating units in the obtained polymer compound are probably represented by the following formula (polymer compound 2):

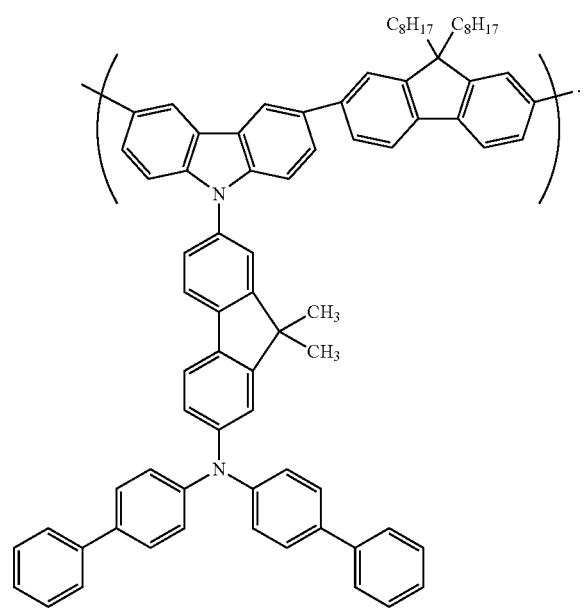

Example 3

In the same manner as in Example 2 except for using 4.00 g of the intermediate 6 in place of the intermediate 3, 2.4 g of a polymer compound was obtained. The weight average molecular weight was $2.87 \times 10^4$, and the number average molecular weight was $1.18 \times 10^4$, each determined by using a polystyrene calibration.

From the starting materials used, the repeating units in the obtained polymer compound are probably represented by the following formula (polymer compound 3):

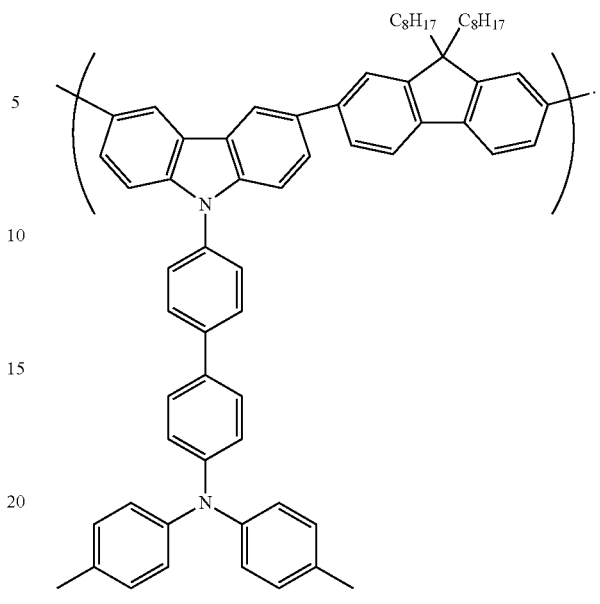

Example 4

Into a reaction vessel, the intermediate 3 (monomer, 5.00 g, 0.0054 mol), a dibromide represented by the left formula below (2.24 g, 0.0041 mol, manufactured by Aldrich), a dibromide represented by the right formula below (0.54 g, 0.0010 mol), toluene (60 tetrabutylammonium bromide (0.19 g), and an aqueous solution (30 ml) of sodium carbonate (1.51 g) were charged, and the inner atmosphere was purged with nitrogen. Thereafter, tetrakis(triphenylphosphine) palladium(0) (0.12 g) was added and the reaction was allowed to proceed in a nitrogen gas atmosphere under refluxing for 40 h.

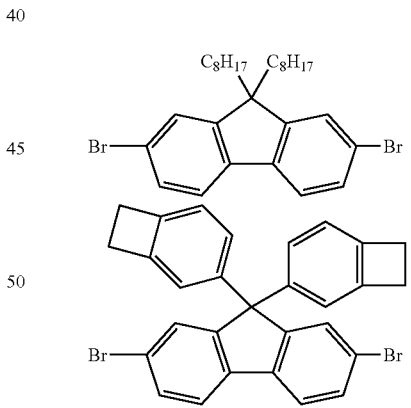

After the reaction, the reaction solution was cooled to around room temperature. Phenylboronic acid (0.0646 g) was added to the cooled reaction solution, and the reaction was further allowed to proceed under refluxing for 2 h. After the reaction, the reaction solution was cooled to around room temperature and washed with water (150 ml) three times.

After washing, the toluene solution was passed through a layered column (400 ml silica gel/50 ml alumina) to remove the catalyst, concentrated under reduced pressure, and then washed with a methanol/acetone solution, thereby obtaining a polymer compound (2.72 g). The weight average molecular weight was $2.71×10^4$, and the number average molecular weight was $1.05×10^4$, each determined by using a polystyrene calibration.

From the starting materials used, the repeating units in the obtained polymer compound are probably represented by the following formulae (polymer compound 4):

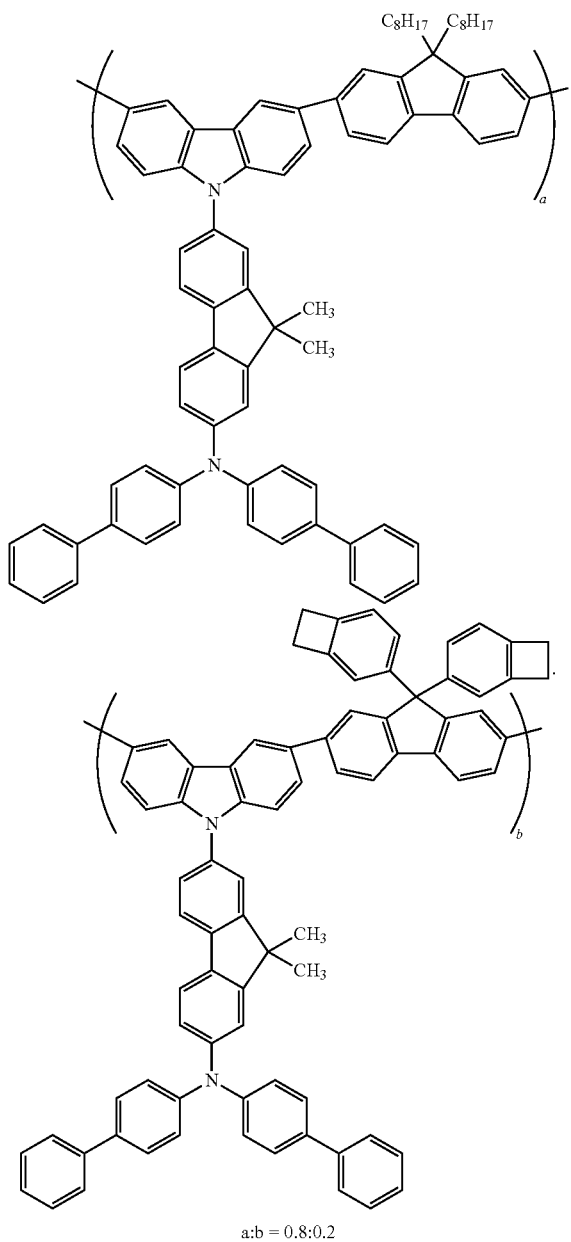

a:b = 0.8:0.2

Example 5

Production of Organic Electroluminescence Device and Evaluation

A glass substrate of 25 mm×75 mm×1.1 mm thickness having an ITO transparent electrode line (product of Geomatec Company) was cleaned by ultrasonic cleaning in isopropyl alcohol for 5 min and then UV ozone cleaning for 30 min. The cleaned glass substrate having a transparent electrode line was mounted to a substrate holder of a vacuum vapor deposition apparatus.

First, a hole injecting layer (thickness: 60 nm) including polyethylenedioxythiophene-polystyrenesulfonic acid (PEDOT-PSS) was formed by a spin coating method on the surface of the glass substrate having the transparent electrode line so as to cover the transparent electrode.

A toluene solution (1.0% by weight) of the polymer compound 1 obtained in Example 1 was spin-coated on the hole injecting layer and dried under reduced pressure at 120° C. for one hour to form a uniform hole transporting layer (thickness: 20 nm).

Next, the following compound EM1 and the following styryl-containing amine compound D1 (light emitting molecule) were vapor co-deposited in a weight ratio of EM1:D1=40:2 to form a light emitting layer (thickness: 40 nm). Then, an Alq film with a thickness of 10 nm was formed on the light emitting layer. This film functions as an electron injecting layer.

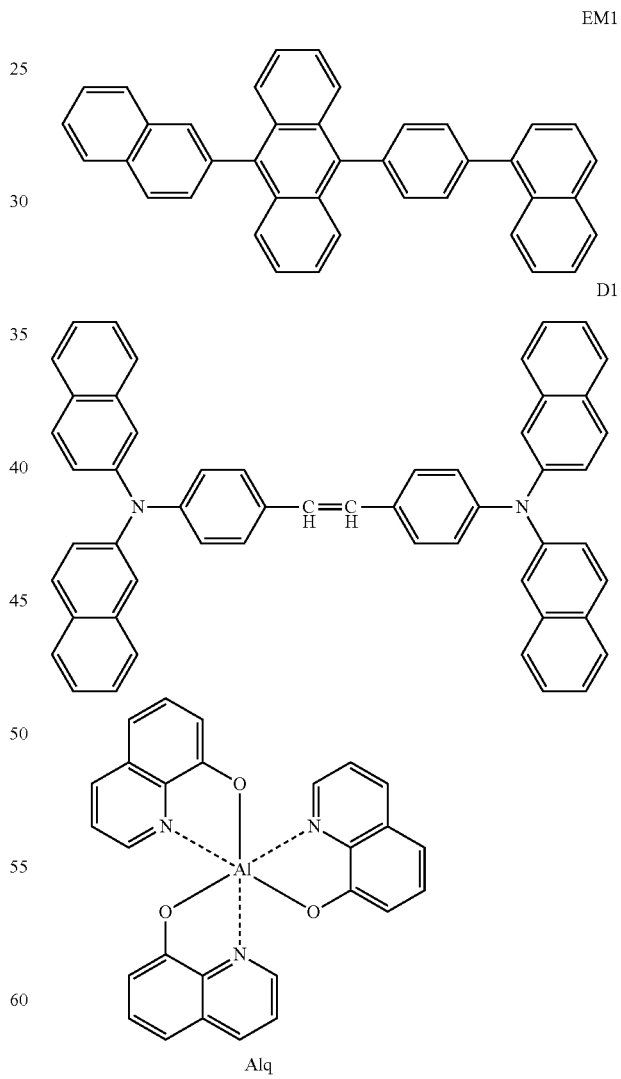

Thereafter, Li (reductive dopant) (Li source: manufactured by SAES Getters) and Alq were binary-deposited to form an Alq:Li film (thickness: 10 nm) as an electron injecting layer (cathode). On the Alq:Li film, metallic Al was vapor-deposited to form a metal cathode.

The organic electroluminescence device thus produced was measured for the emission color, the emission efficiency and the lifetime under the conditions of an initial luminance of 5000 cd/m² and a constant DC drive at room temperature. The results are shown in Table 1.

Example 6

In the same manner as in Example 5 except for using the polymer compound 2 obtained in Example 2 in place of the polymer compound obtained in Example 1, an organic electroluminescence device was produced. The results of the evaluation are shown in Table 1.

Example 7

In the same manner as in Example 5 except for using the polymer compound 3 obtained in Example 3 in place of the polymer compound obtained in Example 1, an organic electroluminescence device was produced. The results of the evaluation are shown in Table 1.

Example 8

A glass substrate of 25 mm×75 mm×1.1 mm thickness having an ITO transparent electrode (product of Geomatec Company) was cleaned by ultrasonic cleaning in isopropyl alcohol for 5 min and then UV ozone cleaning for 30 min. The cleaned glass substrate having a transparent electrode line was mounted to a substrate holder of a vacuum vapor deposition apparatus.

First, a hole injecting layer (thickness: 60 nm) including polyethyleneclioxythiophene-polystyrenesulfonic acid (PE-DOT-PSS) was formed by a spin coating method on the surface of the glass substrate having the transparent electrode line so as to cover the transparent electrode.

A toluene solution (1.0% by weight) of the polymer compound 4 obtained in Example 4 was spin-coated on the hole injecting layer and then dried and heat-cured at 250° C. for 60 min to form a uniform hole transporting layer (thickness: 20 nm).

Next, the compound EM1 and the amine compound D1 (light emitting molecule) were vapor co-deposited in a weight ratio of EM1:D1=40:2 to form a light emitting layer (thickness: 40 nm).

Then, an Alq film with a thickness of 10 nm was formed on the light emitting layer. This film functions as an electron injecting layer. Thereafter, Li (reductive dopant) (Li source: manufactured by SAES Getters) and Alq were binary-deposited to form an Alq:Li film (thickness: 10 nm) as an electron injecting layer (cathode). On the Alq:Li film, metallic Al was vapor-deposited to form a metal cathode, thereby producing an organic electroluminescence device.

The organic electroluminescence device thus produced was measured for the emission color, the emission efficiency and the lifetime under the conditions of an initial luminance of 5000 cd/m² and a constant DC drive at room temperature. The results are shown in Table 1.

Comparative Example 1

In the same manner as in Example 5 except for forming a hole transporting layer with a thickness of 60 nm by spin-coating a 1.0% by weight toluene solution of poly(N-vinylcarbazole) (PVCz) in place of using the polymer compound 1 as the hole transporting material, an organic electroluminescence device was produced. The results of the same evaluation as in Example 5 are shown in Table 1.

Comparative Example 2

In the same manner as in Example 5 except for forming a hole transporting layer with a thickness of 60 nm by spin-coating a 1.0% by weight toluene solution of a polyfluorene derivative (TFB) in place of using the polymer compound 1 as the hole transporting material, an organic electroluminescence device was produced. The results of the same evaluation as in Example 5 are shown in Table 1.

TABLE 1

| | Hole transporting material | Emission efficiency (cd/A) | Half lifetime (h) |
|---|---|---|---|
| Example 5 | polymer compound 1 | 6.5 | 900 |
| Example 6 | polymer compound 2 | 6.0 | 850 |
| Example 7 | polymer compound 3 | 5.4 | 800 |
| Example 8 | polymer compound 4 | 5.8 | 870 |
| Comparative example 1 | PVCz | 3.5 | 350 |
| Comparative example 2 | TFB | 3.8 | 380 |

As seen from the results of Table 1, the organic electroluminescence devices of the examples each having a hole transporting layer including the polymer compound of the invention are excellent in the emission efficiency and the lifetime. As compared with the devices of the examples, the devices of the comparative examples are poor in the emission efficiency and the lifetime.

INDUSTRIAL APPLICABILITY

The polymer compound of the invention is useful as an organic material for organic electroluminescence device, particularly as a charge transporting material. The organic electroluminescence device of the invention is a highly efficient device with a long lifetime.

What is claimed is:

1. A polymer compound comprising repeating units represented by formula (1-1) or (1-2) and repeating units represented by formula (3):

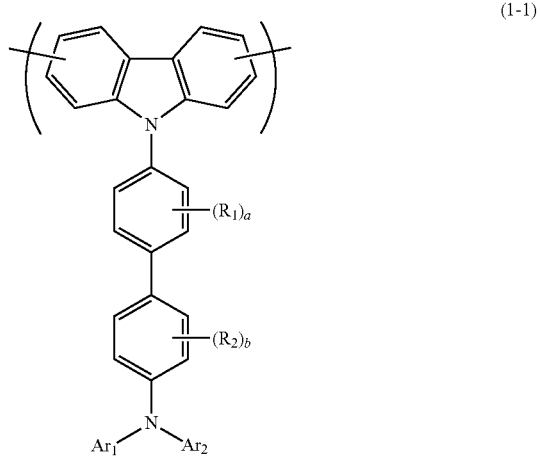

-continued

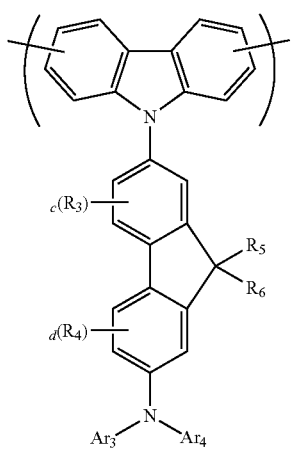
(1-2)

wherein:
each of $R_1$ to $R_6$ independently represents a linear or branched alkyl group having 1 to 20 carbon atoms, a linear or branched alkoxy group having 1 to 20 carbon atoms, a linear or branched alkylthio group having 1 to 20 carbon atoms, a linear or branched alkenyl group having 2 to 20 carbon atoms, a cycloalkyl group having 3 to 20 carbon atoms, an aryl group having 6 to 30 ring carbon atoms, or a heteroaryl group having 5 to 30 ring atoms;
each of a and b represents an integer of 0 to 4;
each of c and d represents an integer of 0 to 3; and
each of $Ar_1$, $Ar_2$, $Ar_3$, and $Ar_4$ independently represents a substituted or unsubstituted aryl group having 6 to 30 ring carbon atoms or a substituted or unsubstituted heteroaryl group having 5 to 30 ring atoms,

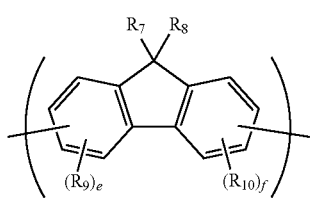
(3)

wherein:
each of $R_7$, $R_8$, $R_9$, and $R_{10}$ independently represents a linear or branched alkyl group having 1 to 20 carbon atoms, a linear or branched alkenyl group having 2 to 20 carbon atoms, a cycloalkyl group having 3 to 20 carbon atoms, an aryl group having 6 to 30 ring carbon atoms, or a heteroaryl group having 5 to 30 ring atoms;
$R_9$ and $R_{10}$ may be bonded to each other to form a hydrocarbon ring;
each of e and f represents an integer of 0 to 3, and when e or f is 2, adjacent groups $R_9$ or adjacent groups $R_{10}$ may be bonded to each other to form a hydrocarbon ring; and
at least one selected from the group consisting of $R_7$, $R_8$, $R_9$, and $R_{10}$ has a substituent comprising a polymerizable functional group.

2. The polymer compound according to claim 1, wherein each of $R_1$ to $R_6$ represents a linear or branched alkyl group having 1 to 20 carbon atoms, a linear or branched alkenyl group having 2 to 20 carbon atoms, a cycloalkyl group having 3 to 20 carbon atoms, an aryl group having 6 to 30 ring carbon atoms, or a heteroaryl group having 5 to 30 ring atoms.

3. The polymer compound according to claim 1, wherein each of $R_1$ to $R_6$ represents a linear or branched alkyl group having 1 to 20 carbon atoms, a linear or branched alkoxy group having 1 to 20 carbon atoms, a linear or branched alkylthio group having 1 to 20 carbon atoms, a linear or branched alkenyl group having 2 to 20 carbon atoms, a cycloalkyl group having 3 to 20 carbon atoms, an aryl group having 6 to 24 ring carbon atoms, or a heteroaryl group having 5 to 24 ring atoms.

4. The polymer compound according to claim 1, wherein each of $R_1$ to $R_6$ represents a linear or branched alkyl group having 1 to 20 carbon atoms, a linear or branched alkenyl group having 2 to 20 carbon atoms, a cycloalkyl group having 3 to 20 carbon atoms, an aryl group having 6 to 24 ring carbon atoms, or a heteroaryl group having 5 to 24 ring atoms.

5. The polymer compound according to claim 1, wherein each of $Ar_1$, $Ar_2$, $Ar_3$, and $Ar_4$ independently represents a substituted or unsubstituted aryl group having 6 to 24 ring carbon atoms or a substituted or unsubstituted heteroaryl group having 5 to 24 ring atoms.

6. The polymer compound according to claim 1, wherein the polymer compound further comprises repeating units represented by formula (2):

(2)

wherein $Ar_5$ represents an arylene group having 6 to 24 ring carbon atoms or a heteroarylene group having 5 to 24 ring atoms.

7. The polymer compound according to claim 1, wherein the group comprising a polymerizable functional group is:
a group represented by formula (i):

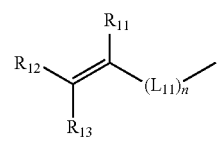
(i)

wherein:
each of $R_{11}$, $R_{12}$, and $R_{13}$ independently represents a hydrogen atom, a fluorine atom, a linear or branched alkyl group having 1 to 20 carbon atoms, or a substituted or unsubstituted aryl group having 6 to 30 ring carbon atoms;
$L_{11}$ represents a divalent linking group; and
n represents 0 or 1, provided that when n is 0, $L_{11}$ is a single bond;
a group represented by formula (ii):

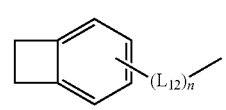
(ii)

wherein $L_{12}$ represents a divalent linking group and n represents 0 or 1,
provided that when n is 0, $L_{12}$ is a single bond;

a group represented by formula (iii):

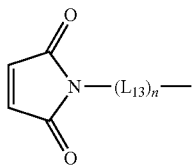

(iii)

wherein $L_{13}$ represents a divalent linking group and n represents 0 or 1,
provided that when n is 0, $L_{13}$ is a single bond;
a group represented by formula (iv):

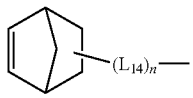

(iv)

wherein $L_{14}$ represents a divalent linking group and n represents 0 or 1,
provided that when n is 0, $L_{14}$ is a single bond;
a group represented by formula (v):

(v)

wherein:
$R_{14}$ represents a hydrogen atom, a substituted or unsubstituted linear or branched alkyl group having 1 to 20 carbon atoms, or a substituted or unsubstituted aryl group having 6 to 30 ring carbon atoms;

$L_{15}$ represents a divalent linking group; and
n represents 0 or 1, provided that when n is 0, $L_{15}$ is a single bond; or
a group other than the group represented by any of formulae (i) to (v), which comprises a ring-forming or ring-opening polymerizable functional group selected from the group consisting of a group comprising a substituted or unsubstituted norbornene skeleton, a group comprising a substituted or unsubstituted epoxy group or oxetane group, a group comprising a lactone structure or a lactam structure, a cyclooctatetraene group, a 1,5-cyclooctadiene group, a 1,ω-diene group, an o-divinylbenzene group, and a 1,ω-diyne group.

8. A material for organic electroluminescence devices comprising the polymer compound according to claim 1.

9. An organic electroluminescence device which comprises at least one layer between a pair of electrodes and the at least one layer comprises at least one polymer compound according to claim 1.

10. The organic electroluminescence device according to claim 9, wherein the layer comprising the polymer compound is a charge injection transport layer.

11. The organic electroluminescence device according to claim 10, wherein the charge injection transport layer is a hole injection transport layer.

12. The organic electroluminescence device according to claim 9, wherein the organic electroluminescence device comprises a light emitting layer between the pair of electrodes, and the light emitting layer comprises a light emitting compound other than the polymer compound.

13. The organic electroluminescence device according to claim 9, wherein the organic electroluminescence device comprises an electron injection transport layer between the pair of electrodes, and the electron injection transport layer comprises an electron injecting compound other than the polymer compound.

* * * * *